(12) United States Patent
Noda

(10) Patent No.: US 6,175,138 B1
(45) Date of Patent: Jan. 16, 2001

(54) SEMICONDUCTOR MEMORY DEVICE AND METHOD OF MANUFACTURING THE SAME

(75) Inventor: Kenji Noda, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/294,090

(22) Filed: Apr. 19, 1999

(30) Foreign Application Priority Data

Apr. 20, 1998 (JP) .................................................. 10-109261
Dec. 4, 1998 (JP) .................................................. 10-346149

(51) Int. Cl.[7] ........................... H01L 29/76; H01L 31/062
(52) U.S. Cl. ......................... 257/392; 257/391; 257/903; 365/156
(58) Field of Search ..................................... 257/392, 404, 257/208, 903, 904, 391, 401, 408; 365/156, 154

(56) References Cited

U.S. PATENT DOCUMENTS

| | | | | |
|---|---|---|---|---|
| 4,525,811 | * | 7/1985 | Masuoka | 257/392 |
| 5,285,096 | * | 2/1994 | Ando et al. | 257/392 |
| 5,600,588 | * | 2/1997 | Kawashima | 365/156 |
| 5,923,582 | * | 7/1999 | Voss | 365/154 |
| 5,939,762 | * | 8/1999 | Lien | 257/903 |
| 6,093,950 | * | 7/2000 | Kuroda | 257/392 |

FOREIGN PATENT DOCUMENTS 7-302847    11/1995   (JP) .

* cited by examiner

Primary Examiner—Michael Trinh
(74) Attorney, Agent, or Firm—McGinn & Gibb, PLLC

(57) ABSTRACT

In a memory device of an SRAM, a threshold voltage (Vthn) of each driving MOS transistor consisting of the N-type MOS transistor is set larger than a threshold voltage (Vthp) of each MOS transistor for selecting an address consisting of the P-type MOS transistor.

17 Claims, 20 Drawing Sheets

SEMICONDUCTOR MEMORY DEVICE AND METHOD OF MANUFACTURING THE SAME

BACKGROUND OF THE INVENTION

This invention relates to a semiconductor memory device and a method of manufacturing the same, and in particular, to a semiconductor memory device consisting of an SRAM (Static Random Access Memory) and a method of manufacturing the same.

A memory, which is well known as an LSI (Large Scale Integrated Circuit), is generally classified into an SRAM (Static Random Access Memory) and a DRAM (Dynamic Random Access Memory). Most of these memories are composed of MOS (Metal Oxide Semiconductor) transistors because the MOS transistor is superior in integration.

In this event, the SRAM has rapid operation speed in comparison with the DRAM. Consequently, the SRAM is widely used, for example, as a cache memory in which a high-speed operation is particularly required.

The SRAM is basically composed of a flip-flop circuit. In such a flip-flop circuit, an input electrode and an output electrode are connected to each other by the use of a pair of driving MOS transistors, and a load device (namely, pull-up device) is coupled to each output electrode.

Herein, the SRAM is generally classified into a CMOS (Complementary Metal Oxide Semiconductor) type and a high resistance load type. In this case, the MOS transistor is used as the load device of the flip-flop circuit in the CMOS type while a high resistance thin-film, such as polysilicon, is used as the load device in the high resistance load type.

With such a structure, MOS transistors for selecting addresses are connected to a pair of output electrodes, respectively. Thereby, one memory cell is structured.

In the CMOS type SRAM, one memory cell is structured by six MOS transistors. In consequence, one memory cell has a large occupied area in a semiconductor substrate.

In contrast, one memory cell is structured by four MOS transistors in the high resistance type SRAM, and the high resistance thin-film is formed at an upper portion of the MOS transistor. Thereby, the cell area can be reduced in the high resistance type SRAM.

In the meanwhile, when the cell area is reduced in the high resistance type SRAM, the memory cell having the high resistance load device consisting of the polysilicon must be formed by a laminate structure in a limited space. Consequently, the memory structure inevitably becomes complicated, and manufacturing step is also increased.

To solve such a problem, disclosure has been made about a specific SRAM in Japanese Unexamined Patent Publication (JP-A) No. Hei. 7-302847. In this SRAM, a memory cell is composed of a pair of driving MOS transistors and a pair of MOS transistors for selecting addresses.

In this event, each of the driving MOS transistors is structured by an N-type MOS transistor while each of the MOS transistors for selecting the addresses is structured by a P-type MOS transistors. With this structure, no load device is connected to an output node of each driving MOS transistor.

In this memory cell, the load devices, which are generally connected to the output nodes of the driving MOS transistors, are unnecessary. Thereby, the memory cell structure does not become complex. Further, the manufacturing step can be also reduced.

However, when the above-mentioned conventional SRAM is operated, an intimidate potential is inevitably necessary. In consequence, three kinds of potentials including a power supply potential (Vcc) and a ground potential (Vss) are required.

Specifically, the load device is unnecessary in the conventional SRAM, as mentioned before. Thereby, it is necessary to operate the MOS transistor for selecting the address as the load device in a stand-by operation.

To this end, electric elimination is compensated by flowing sub-threshold current into the MOS transistor for selecting the address. In order to flow the sub-threshold current, the intermediate potential is given to the MOS transistor for selecting the address.

Thus, a third potential (namely, the intermediate potential) must be set or prepared in addition to the two kinds of first and second potentials (namely, the power supply potential and the ground potential) which are originally necessary in the conventional SRAM.

This means that new other power supply circuit must be prepared. In consequence, a peripheral circuit of the SRAM becomes complex. Further, a circuit for generating the intermediate potential generally increases consumption current (namely, stand-by current) during the stand-by operation.

SUMMARY OF THE INVENTION

It is therefore an object of this invention to provide a semiconductor memory device which is capable of retaining a data signal of a memory cell without complicating a power supply structure and increasing stand-by current on the condition that a load device is unnecessary, and a method of manufacturing the same.

According to this invention, a semiconductor memory device has a first and second bit lines and a word line.

Further, the device includes a first MIS transistor for driving. In this event, the first MIS transistor has a first input electrode and a first output electrode and has a first conductive type and a first threshold voltage.

Moreover, the device includes a second MIS transistor for driving. In this event, the second MIS transistor has a second input electrode and a second output electrode and has the first conductive type and the first threshold voltage.

Herein, the first input electrode is connected to the second output electrode while the second input electrode is connected to the first output electrode.

Further, the device includes a third MIS transistor for selecting an address. In this event, the third MIS transistor is connected between the first bit line and the first output electrode and has a third input electrode and has a second conductive type and a second threshold voltage.

Herein, the third input electrode is connected to the word line and the second conductive type is opposite to the first conductive type.

In addition, the device includes a fourth MIS transistor for selecting an address. In this event, the fourth MIS transistor is connected between the second bit line and the second output electrode and has a fourth input electrode and has the second conductive type and the second threshold voltage. Herein, the fourth input electrode is connected to the word line.

With this structure, the first threshold voltage exceeds the second threshold voltage.

Each of the first and second MIS transistors includes a channel region. Further, a threshold voltage setting layer is placed in the channel region. In this condition, the first threshold voltage is set larger than the second threshold voltage via the threshold voltage setting layer. Herein, the threshold voltage setting layer includes impurity of the second conductive type.

Moreover, each of the first and second MIS transistors has first leak current while each of the second and third MIS transistor has second leak current. Under this circumstance, the second leak current exceeds the first leak current.

In consequence, sub-threshold current flows through each of said first and second MIS transistors when a power supply potential is given thereto during a stand-by operation.

For instance, the first conductive type is an N-type while the second conductive type is a P-type.

More specifically, the threshold voltage Vthn of each driving MOS transistor consisting of the N-type MOS transistor is set larger than a threshold voltage Vthp of each MOS transistor for selecting the address consisting of the P-type MOS transistor in the memory cell of the SRAM having no the load device.

In consequence, the data signal of the memory cell can be retained by using the two kinds of potentials (the normal power supply potential and the ground potential) without the third potential.

Namely, the leak current ILp of each MOS transistor for selecting the address becomes larger than the leak current ILn of each driving MOS transistor by satisfying the above-mentioned relationship (|Vthn|>|Vthp|). Namely, the relationship of (ILp>ILn) can be satisfied.

Thereby, when the power supply potential is given to the gate electrode of each MOS transistor for selecting the address during the stand-by operation, the elimination of the electric charge can be compensated by flowing sub-threshold current into each driving MOS transistor.

Consequently, the output node of each driving MOS transistor can be kept to the power supply potential. As a result, the data signal can be retained because the elimination of the electric charge of the memory cell can be compensated as mentioned before.

Moreover, the third potential becomes unnecessary by using only the two kinds of potentials, as mentioned above. In consequence, the peripheral circuit of the SRAM does not become complex.

Thus, the semiconductor memory device is capable of retaining the data signal of the memory cell without complicating the power supply structure and increasing the stand-by current on the condition that the load device is unnecessary.

DESCRIPTION OF THE PREFERRED EMBODIMENT

Figure 1:
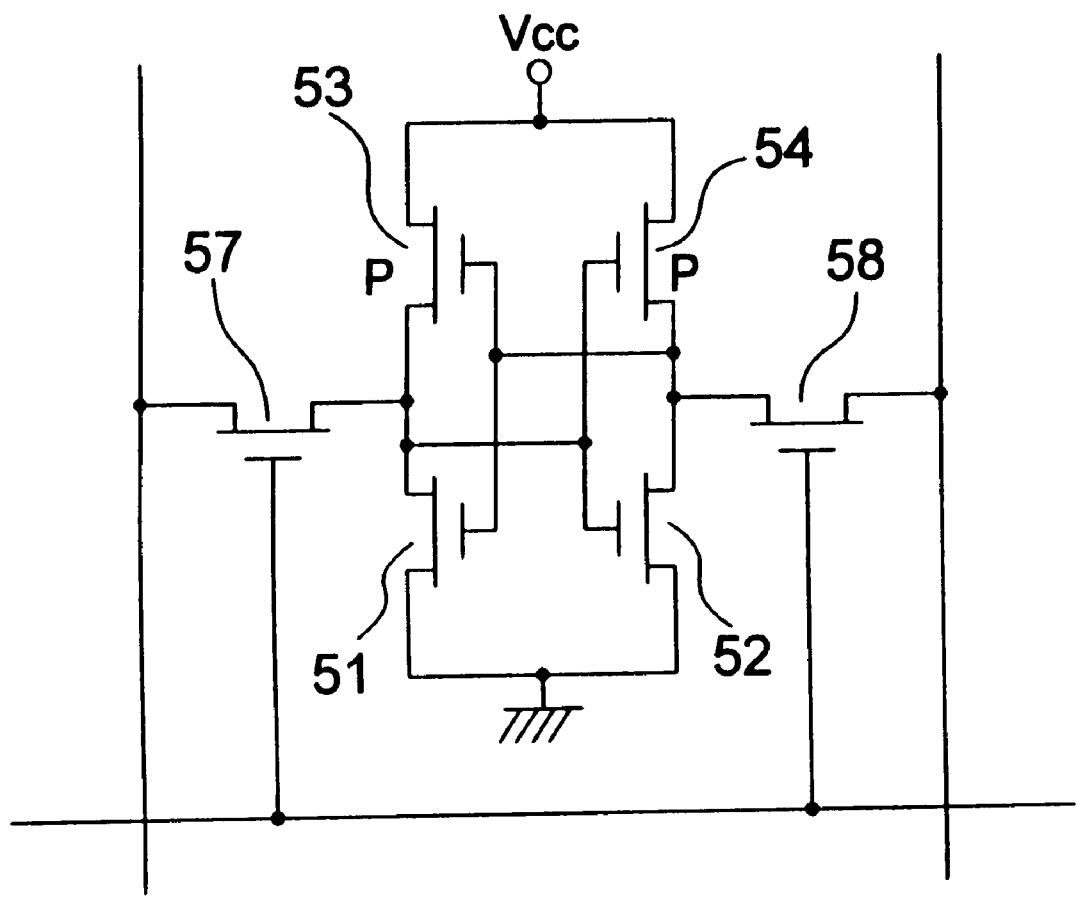
FIG. 1 is a circuit diagram showing a conventional semiconductor memory device.
Figure 2:
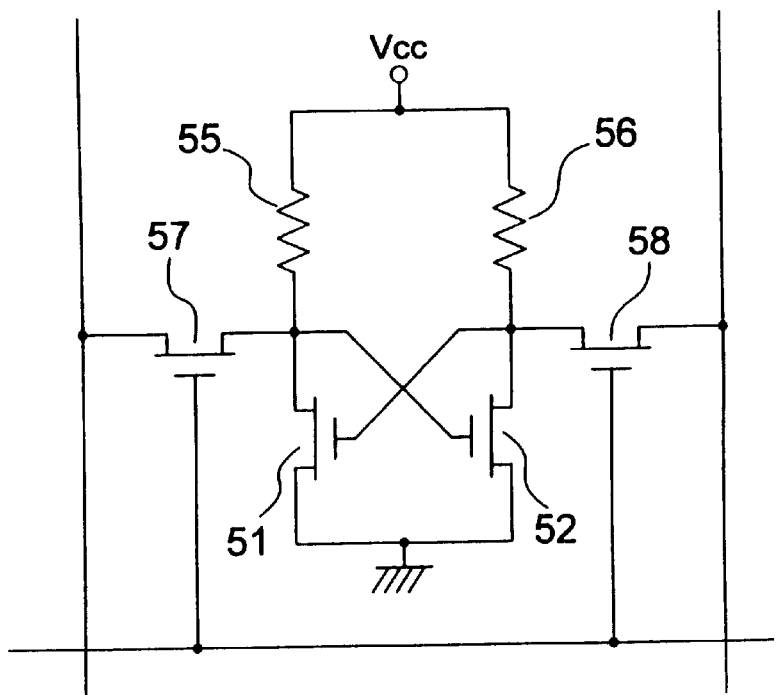
FIG. 2 is a circuit diagram showing a conventional semiconductor memory device.
Figure 3:
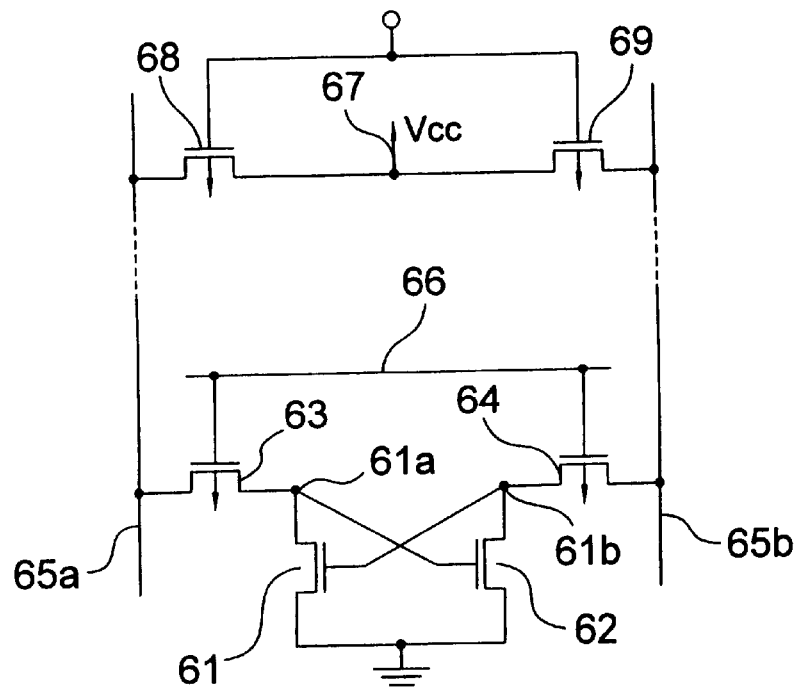
FIG. 3 is a circuit diagram showing a conventional semiconductor memory device.

Referring to FIGS. 1 through 3, conventional semiconductor memory devices will first be described for a better understanding of this invention. The semiconductor memory devices are equivalent to the conventional memory devices mentioned in the preamble of the instant specification.

In FIG. 1, an input electrode and an output electrode are connected to each other by the use of a pair of driving MOS transistors 51 and 52, and load devices 53 and 54 (namely, pull-up device) are coupled to each output electrode. In the CMOS type SRAM, the MOS transistors 53 and 54 are used as the load devices of the flip-flop circuit.

With such a structure, MOS transistors 57 and 58 for selecting addresses are connected to a pair of output electrodes, respectively. Thereby, one memory cell is structured.

Herein, each of the driving MOS transistors 51 and 52 are composed of an N-type MOS transistor while each of the load devices 53 and 54 are composed of a P-type MOS transistors. Each of the MOS transistors 57 and 58 is structured by an N-type MOS transistors.

In FIG. 2, an input electrode and an output electrode are connected to each other by the use of a pair of driving MOS transistors 51 and 52, and load devices 55 and 56 are coupled to output electrodes. In the high resistance load type SRAM, a high resistance thin-film, such as polysilicon, is used as each of the load device 55 and 56.

With such a structure, MOS transistors 57 and 58 for selecting addresses are connected to a pair of output electrodes, respectively. Thereby, one memory cell is structured.

Herein, each of the driving MOS transistors 51 and 52 is composed of an N-type MOS transistors while each of the MOS transistors 57 and 58 is structured by a P-type MOS transistor.

In the CMOS type SRAM, one memory cell is structured by six MOS transistors, as illustrated in FIG. 1. In consequence, one memory cell has a large occupied area in a semiconductor substrate.

In contrast, one memory cell is structured by four MOS transistors in the high resistance type SRAM, as illustrated in FIG. 2. Although the cell area is reduced in the high resistance type SRAM illustrated in FIG. 2, the memory cell having the high resistance load device must be formed by a laminate structure in a limited space. Consequently, the memory structure inevitably becomes complicated, and manufacturing step is also increased.

To solve such a problem, disclosure has been made about a specific SRAM in Japanese Unexamined Patent Publication (JP-A) No. Hei. 7-302847.

In this SRAM, a memory cell is composed of a pair of driving MOS transistors 61 and 62, and a pair of MOS transistors 63 and 64 for selecting addresses, as illustrated in FIG. 3.

In this event, each of the driving MOS transistors 61 and 62 is structured by an N-type MOS transistor while each of the MOS transistors 63 and 64 is structured by a P-type MOS transistor.

Herein, the reference numerals 65a and 65b denote bit lines, and the reference numeral 66 denotes a word line. Further, the reference numeral 67 denotes a power supply (Vcc), and the reference numerals 68 and 69 denote path-transistors.

With this structure, no load device is connected to an output node of each of the driving MOS transistors 61 and 62.

In this memory cell, the load devices become unnecessary. Thereby, the memory cell structure does not become complicated. Further, the manufacturing step can be reduced.

However, the conventional SRAM illustrated in FIG. 3 requires an intermediate potential. In consequence, three kinds of potentials including a power supply potential (Vcc) and a ground potential (Vss) are necessary.

Specifically, the load device is unnecessary in the conventional SRAM illustrated in FIG. 3, as mentioned before. Thereby, it is necessary to operate the MOS transistors 63 and 64 as the load devices in a standby-operation.

To this end, electric elimination is compensated by flowing sub-threshold current into each of the MOS transistors 63 and 64. In order to flow the sub-threshold current, the intermediate potential must be given to the MOS transistors 63 and 64.

Thus, a third potential (namely, the intermediate potential) must be set or prepared in addition to the two kinds of first and second potentials (namely, the power supply potential and the ground potential) in the conventional SRAM illustrated in FIG. 3.

Taking the above-mentioned problem into consideration, this invention provides a semiconductor memory device which is capable of retaining a data signal of a memory cell without complicating a power supply structure and increasing stand-by current on the condition that a load device is unnecessary.

(First Embodiment)

Figure 4:
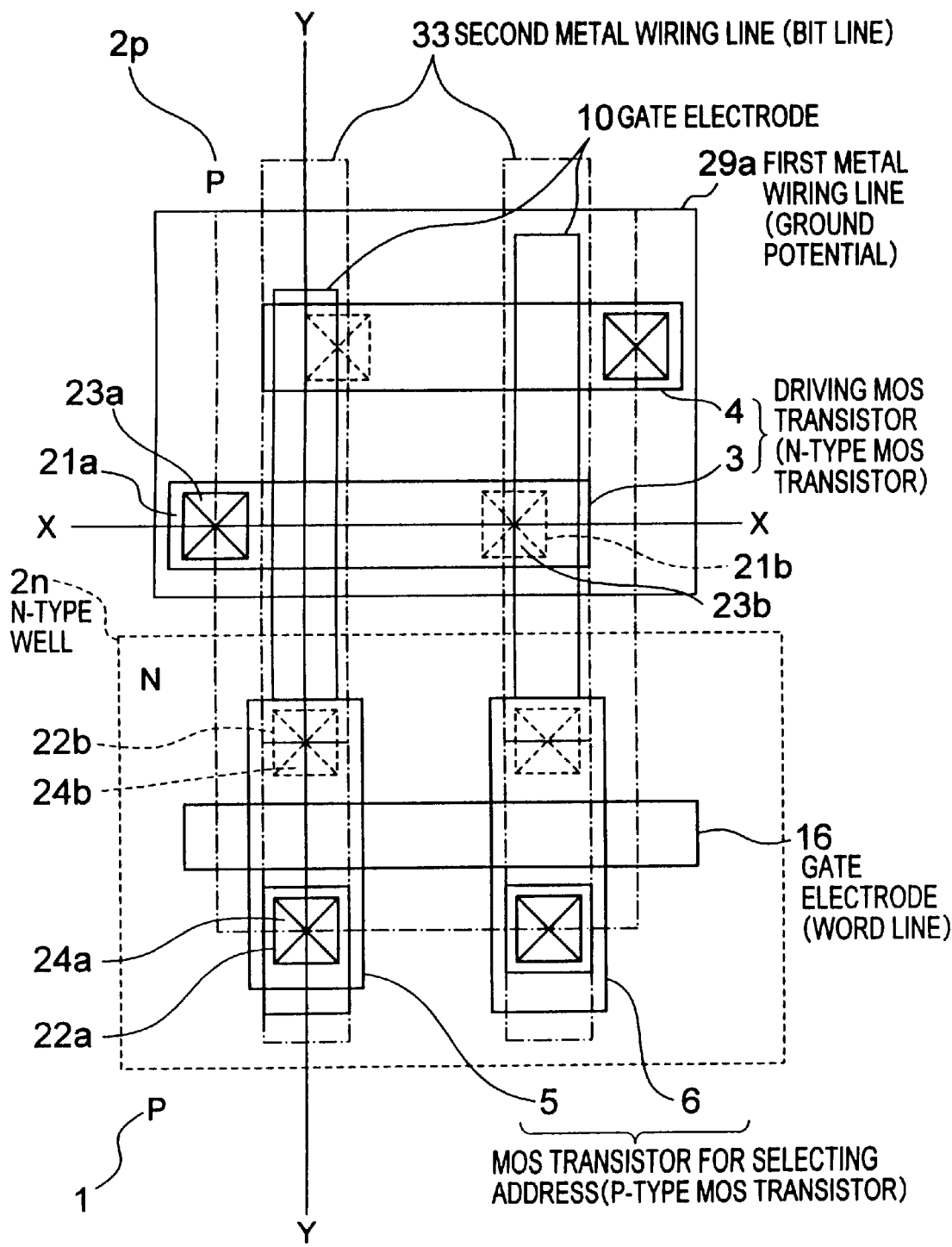
FIG. 4 is a plane view showing a structure of a semiconductor memory device according to a first embodiment of this invention.
Figure 5:
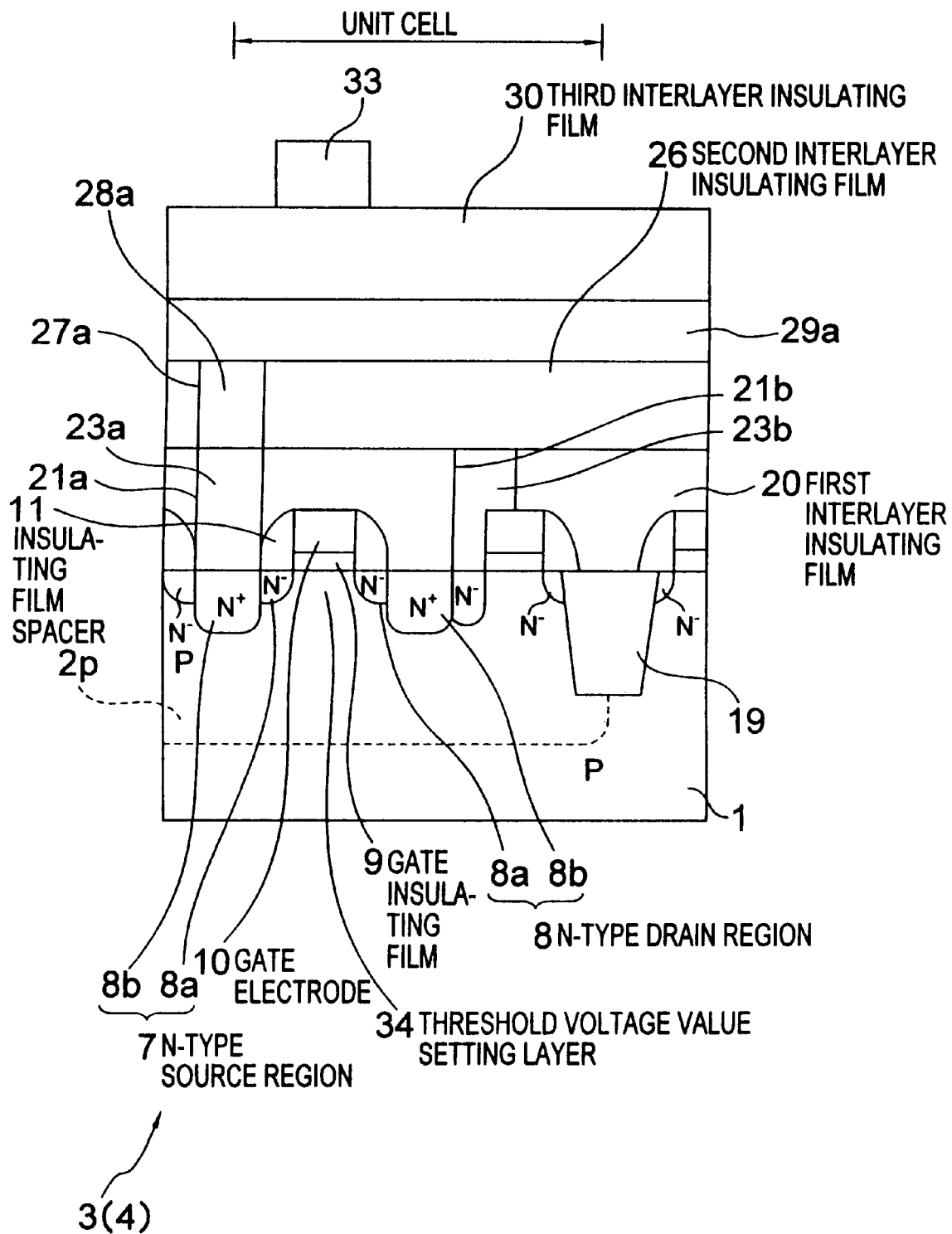
FIG. 5 is a cross sectional view, taken the semiconductor memory device illustrated in FIG. 4 along X—X line.
Figure 6:
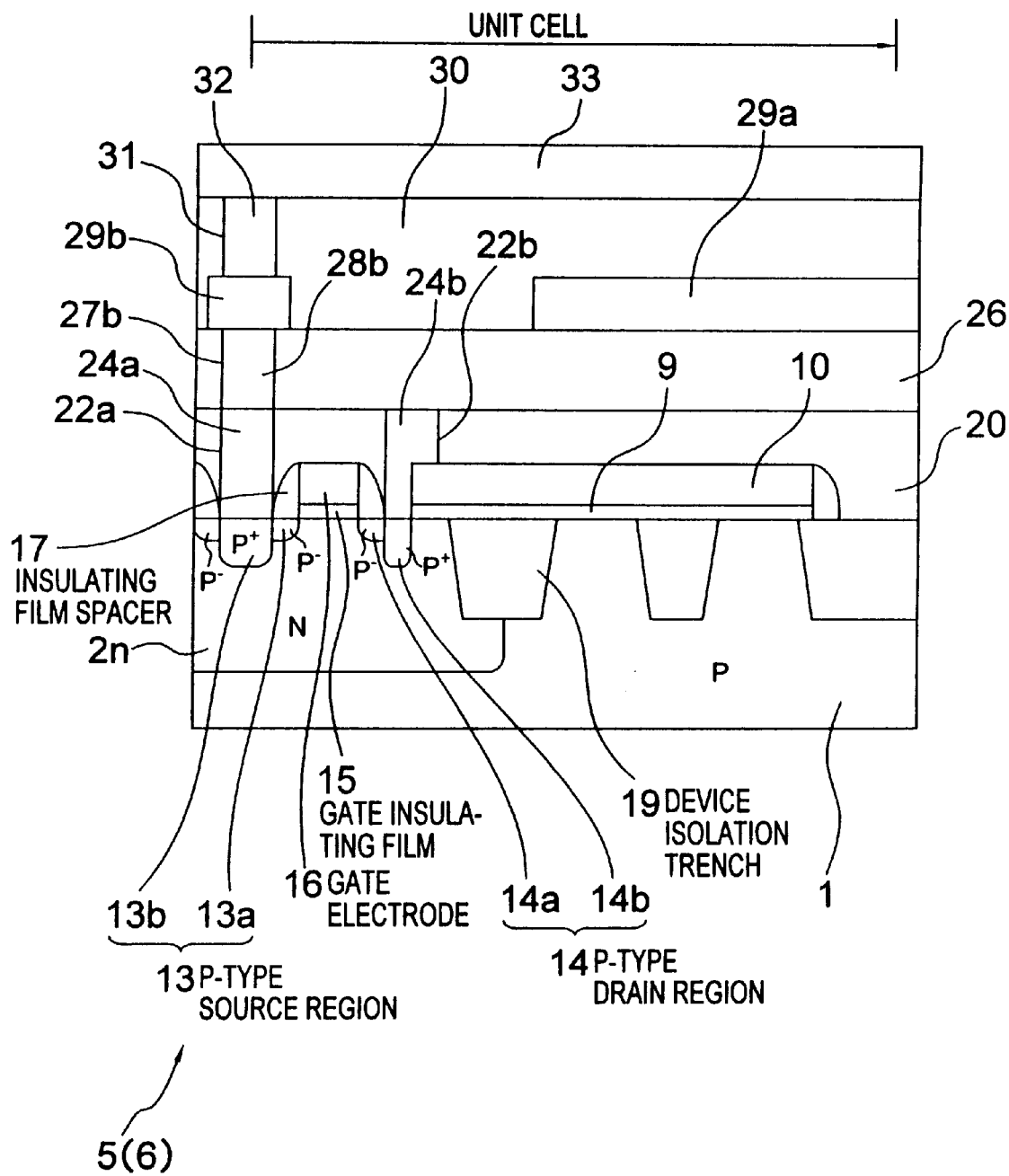
FIG. 6 is a cross sectional view, taken the semiconductor memory device illustrated in FIG. 4 along Y—Y line.

Referring FIGS. 4 through 6, description will be made about a semiconductor memory cell according to a first embodiment of this invention.

In the illustrated semiconductor memory device, an N-type well 2n is formed in a P-type semiconductor substrate consisting of a Si single crystal, as shown in FIGS. 1 through 3. In this event, a pair of MOS transistors 5 and 6 for selecting addresses are placed in the N-well 2n while a pair of driving MOS transistors 3 and 4 are placed in a P-well 2p in the P-type semiconductor substrate 1.

Herein, each of the MOS transistors 5 and 6 is structured by a P-type MOS transistor while each of the driving MOS transistors 3 and 4 is structured by an N-type MOS transistor. In this case, the MOS transistors 3,4 and the MOS transistors 5, 6 constitute a memory cell having the same structure as that illustrated in FIG. 3.

Each of the driving MOS transistors 3 and 4 has an N-type source region 7 and an N-type drain region 8. In this event, the N-type source region 7 is composed of an N$^-$-type region 7a and an N$^+$-type region 7b while the N-type drain region 8 is composed of an N$^-$-type region 8a and an N$^+$-type region 8b.

Further, a gate electrode 10 is placed on a surface of the P-type semiconductor substrate 1 between the N-type source region 7 and the N-type drain region 8 via a gate insulating film 9, such as, an oxide film (SiO$_2$).

Moreover, side surfaces of the gate insulating film 9 and the gate electrode 10 are coated with an insulating film spacer 11, such as, an oxide film. Herein, it is to be noted that only one MOS transistor 3 is illustrated for convenience in FIG. 5.

On the other hand, each of the MOS transistors 5 and 6 for selecting the addresses has a P-type source region 13 and a P-type drain region 14. In this event, the P-type source region 13 is composed of a P$^-$-type region 13a and a P$^+$-type region 13b while the P-type drain region 14 is composed of a P$^-$-type region 14a and a P$^+$-type region 14b.

Further, a gate electrode 16 is placed on a surface of the N-type well 2n between the P-type source region 13 and the P-type drain region 14 via a gate insulating film 15, such as, an oxide film.

Moreover, side surfaces of the gate insulating film 15 and the gate electrode 16 are coated with an insulating film spacer 17, such as, an oxide film. Herein, it is to be noted that only one MOS transistor 5 is illustrated for convenience in FIG. 6.

In this case, the gate electrode 16 is extended on upper surface of the N-type well 2n to constitute a word line. Further, each of the N$^-$-type regions 7a, 8a and the P$^-$-type regions 13a, 14a constitutes an LDD (Lightly Doped Drain) region.

A device isolation trench 19 is arranged between the P-type semiconductor substrate 1 and the N-type well 2n. Thereby, the both N-type MOS transistor 3,4 and the P-type MOS transistor 5,6 are electrically separated or isolated.

In this event, the device isolation trench 19 is structured by burying or embedding an insulator, such as, an oxide film, in the trench formed by etching on a surface of the semiconductor substrate 1.

Surfaces of the gate electrodes 10 and 16 are coated with a first interlayer insulating film 20. Herein, the first interlayer insulating film 20 is formed by an oxide film made by the CVD method, a BSG (Boron-Silicate Glass) film, a PSG (Phospho-Silicate Glass) film, and a BPSG (Boron-Phospho-Silicate Glass) film and the like.

Contact holes 21a and 22a are formed on surfaces of the N-type source region 7 of each MOS transistors 3, 4 and the P-type source region 13 of each MOS transistor 5, 6 in the first interlayer insulating film 20. In this event, tungsten (W) plugs 23a and 24a (source electrodes) are formed in the contact holes 21a and 22a.

Likewise, contact holes 21b and 22b are formed on a surface of the N-type drain region 8 of each MOS transistors 3, 4 and the P-type source region 14 of each MOS transistor 5, 6 in the first interlayer insulating film 20. In this event, tungsten (W) plugs 23b and 24b (drain electrodes) are formed in the contact holes 21b and 22b.

Surfaces of the W plugs 23a, 23b and the W plugs 24a, 24b is coated with a second interlayer insulating film 26. In this event, the second interlayer insulating film is formed by an oxide film made by the CVD method, the BSG film, the PSG film, and the BPSG film and the like. In this event, viaholes 27a and 27b are formed in the second interlayer insulating film 26.

In this case, a W plug 28a is formed in the viahole 27a so as to contact with the W plug 23a while a W plug 28b is formed in the viahole 27b so as to contact with the W plug 24a.

Further, a first metal wiring line 29a for giving a ground potential is formed so as to contact with the W plugs 28a on the second interlayer insulating film 26. Moreover, an intermediate wiring line 29b is formed so as to contact with the W plugs 28b on the second interlayer insulating film 26.

A surface of the first metal wiring line 29a is coated with a third interlayer insulating film 30. In this event, the third interlayer insulating film 30 is formed by an oxide film made by the CVD method, the BSG film, the PSG film, and the BPSG film and the like.

Further, a viahole 31 is formed in the third interlayer insulating film 30. A W via-plug 32 is formed so as to contact with the intermediate wiring line 29b in the viahole 31. Moreover, a second metal wiring line 33, which constitutes a bit line, is formed so as to contact with the W via-plug 32 on the third interlayer insulating film 30.

In this event, a pair of driving MOS transistors 3, 4 and a pair of MOS transistors for selecting the addresses are arranged so that directions of flowing current are substantially perpendicular to each other.

Further, active regions including the N-type source and drain regions 7, 8 and the P-type source and drain regions 13,14 which constitute each N-type MOS transistor 3, 4 and each P-type MOS transistor 5,6 are formed in substantially rectangular shape.

Herein, a threshold voltage Vthn of each driving MOS transistor 3, 4 consisting of the N-type MOS transistor is set larger than a threshold voltage Vthp of each MOS transistor 5, 6 for selecting the address consisting of the P-type MOS transistor in an absolute value (namely, $|Vthn|>|Vthp|$). This relationship is achieved by forming a threshold voltage adjusting layer 34 in a channel region of each MOS transistor 3, 4, as illustrated in FIG. 5.

To this end, P-type impurity ions are implanted or doped into the surface of the N-type semiconductor substrate 1 in advance. Thereby, the threshold voltages satisfy the above-mentioned relationship during the manufacture of the MOS transistors 3 and 4.

By setting or adjusting the threshold voltages of the MOS transistors 3 and 4, a data signal stored in the memory cell can be retained without the third potential other than two kinds of potentials (power supply potential and ground potential) in the SRAM having no load device.

Namely, leak current ILp of each MOS transistor 5, 6 becomes larger than leak current ILn of each driving MOS transistor 3, 4 by satisfying the above-mentioned relationship (namely, ILp>ILn).

Thereby, when a power supply potential is given to the gate electrode of each MOS transistor 5, 6 during the stand-by operation, elimination of electric charge can be compensated by flowing sub-threshold current into each MOS transistor 5, 6.

Consequently, each output node of each driving MOS transistor 3, 4 can be kept to the power supply potential. As a result, the data signal can be retained because the elimination of the electric charge of the memory cell can be compensated, as mentioned before.

Further, a peripheral circuit is placed around the memory cell consisting of the driving MOS transistors 3, 4 and the MOS transistors 5, 6. In this case, the peripheral circuit is composed of N-type MOS transistors and P-type MOS transistors.

In this peripheral circuit, threshold voltage of the N-type and P-type MOS transistors are substantially identical to each other to satisfy a high-speed operation and low stand-by current during the stand-by operation.

Herein, it is to be noted that the threshold voltage of each driving MOS transistor 3, 4 consisting of the N-type MOS transistor is set larger than that of the N-type MOS transistor in the peripheral circuit.

Subsequently, description will be made about a method of manufacturing the semiconductor memory device with reference to FIGS. 7 through 23.

Figure 7:
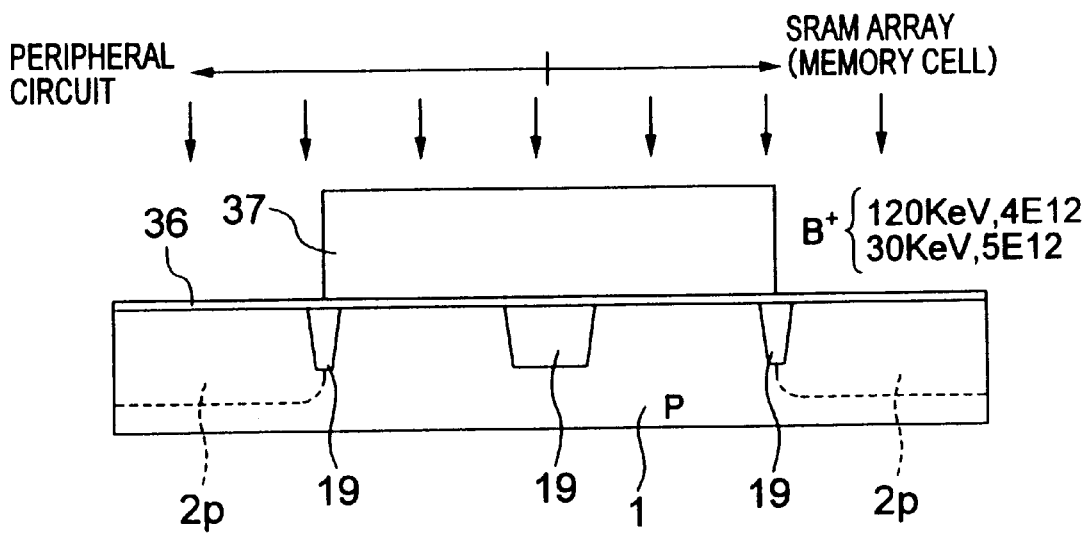
FIG. 7 is a step diagram showing a method of manufacturing a semiconductor memory device according to the first embodiment of this invention.

First, an oxide film 36 is deposited to a film thickness of about 15 nm by the thermal oxidation method on a P-type semiconductor substrate 1, as illustrated in FIG. 7. In this event, a device isolation trench 19 is formed in the semiconductor substrate 1 in advance. Herein, it is to be noted that a memory cell is formed at a right-hand region on the basis of a central portion of the semiconductor substrate 1 while a peripheral circuit is formed at a left-hand region on the basis of the central portion.

Successively, a region for forming a P-type MOS transistor which constitutes each MOS transistors 5, 6 for selecting an address in the memory cell and a region for forming a P-type MOS transistor in the peripheral circuit are masked by a photoresist film 37.

Next, boron (B) as a P-type impurity is implanted with energy of about 120 KeV and dose of about $4 \times 10^{12}/cm^2$. Thereafter, the boron (B) as the P-type impurity is implanted with energy of about 30 KeV and dose of about $5 \times 10^{12}/cm^2$ to form a P-type well 2p.

Figure 8:
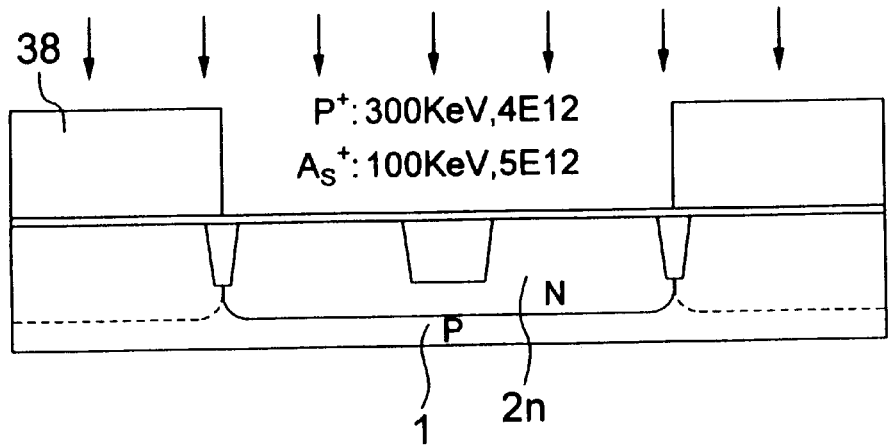
FIG. 8 is a step diagram showing a method of manufacturing a semiconductor memory device according to the first embodiment of this invention.

Subsequently, regions for forming N-type MOS transistors in the P-type semiconductor substrate 1 are masked with a photoresist 38, as illustrated in FIG. 8.

Successively, phosphorus (P) as an N-type impurity is implanted with energy of about 300 KeV and dose of about $4 \times 10^{12}/cm^2$. Thereafter, arsenic (As) as the N-type impurity is implanted with energy of about 100 KeV and dose of about $5 \times 10^{12}/cm^2$ to form an N-type well 2n.

In this case, impurity concentrations of the P-type well 2p and the N-type well 2n are selected so that the threshold voltages of the N-type MOS transistor and the P-type MOS transistor which are formed in each well 2p, 2n are substantially identical to each other.

Figure 9:
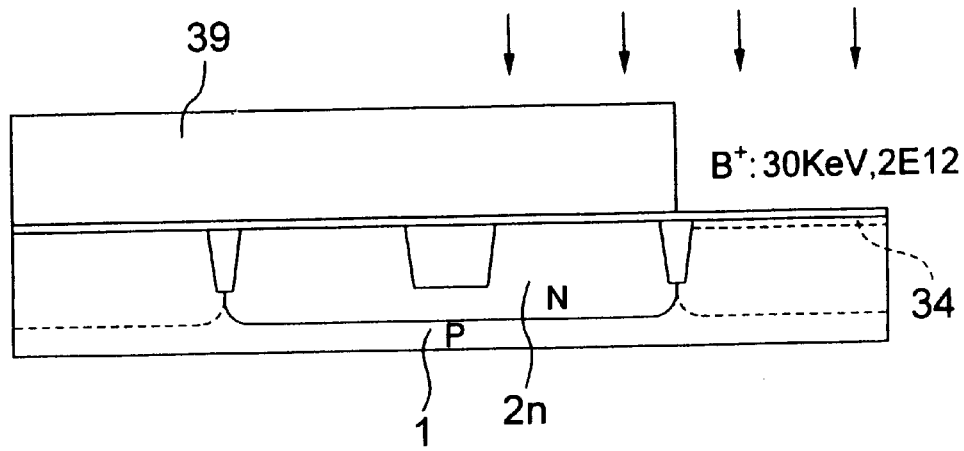
FIG. 9 is a step diagram showing a method of manufacturing a semiconductor memory device according to the first embodiment of this invention.

Subsequently, an entire surface except for the region for forming a pair of driving MOS transistors 3,4 of the memory cell in the P-type semiconductor substrate 1 is masked with a photoresist film 39, as illustrated in FIG. 9.

Successively, the boron as the P-type impurity is implanted with energy of about 30 KeV and dose of about $2 \times 10^{12}/cm^2$ to form the threshold voltage setting layer 34. Thereby, the boron is doped into only the region for forming the N-type MOS transistor constituting a pair of driving MOS transistors 3,4 in advance.

In consequence, the threshold voltage (Vthn) of the N-type MOS transistor 3,4, which will be formed in the subsequent step, is set or adjusted larger than that (Vthp) of the P-type MOS transistor 5,6 constituting each MOS transistors 5,6 for selecting the address.

Figure 10:
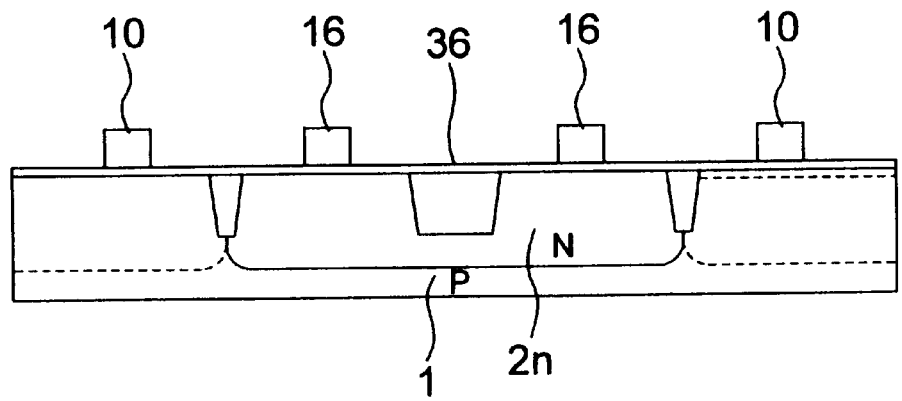
FIG. 10 is a step diagram showing a method of manufacturing a semiconductor memory device according to the first embodiment of this invention.

Subsequently, the photoresist film 39 is removed, as illustrated in FIG. 10. Thereafter, a polysilicon film is deposited to a film thickness of about 200 nm by the use of the CVD method on the oxide film 36.

Successively, the gate electrodes 10 of the N-type MOS transistors and the gate electrodes 16 of the P-type MOS transistors are formed by removing unnecessary portions by the use of the photolithography method.

Figure 11:
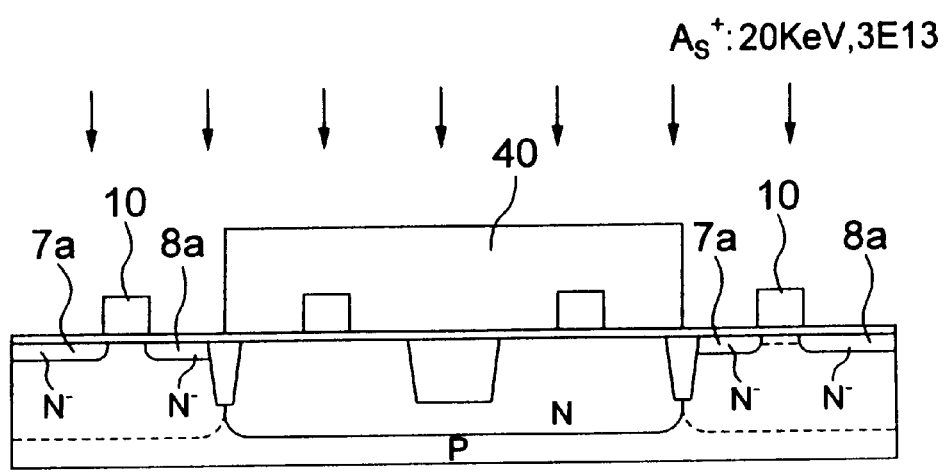
FIG. 11 is a step diagram showing a method of manufacturing a semiconductor memory device according to the first embodiment of this invention.

Next, a region for forming the P-type MOS transistors in the P-type semiconductor substrate 1 is masked with a photoresist film 40, as illustrated in FIG. 11.

Successively, As as the N-type impurity is implanted with energy of about 20 KeV and dose of about $2 \times 10^{13}/cm^2$ to form the N⁻-type source regions 7a and N⁻-type drain regions 8a. Herein, the N⁻-type source region 7a and N⁻-type drain region 8a become the LDD regions. These regions 7a and 8a are formed in the self-alignment manner using the gate electrode 10 as a mask.

Figure 12:
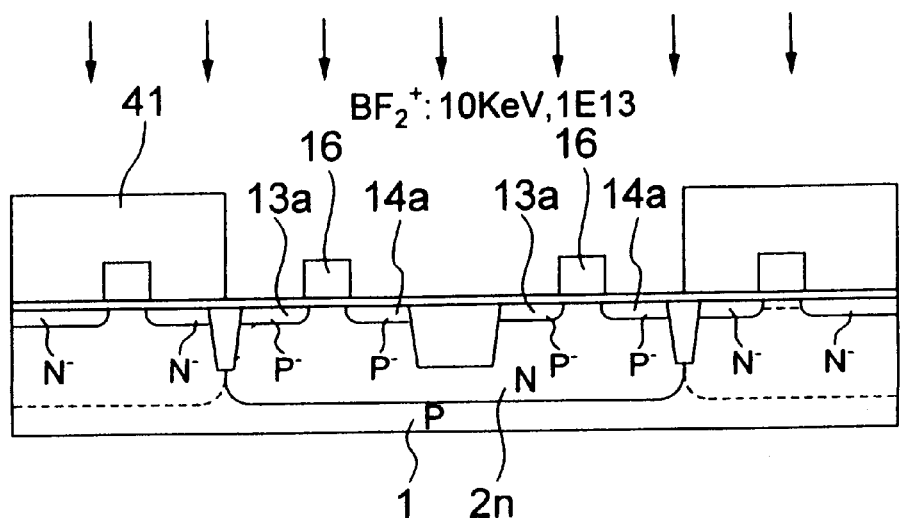
FIG. 12 is a step diagram showing a method of manufacturing a semiconductor memory device according to the first embodiment of this invention.

Subsequently, the region for forming the N-type MOS transistors in the P-type semiconductor substrate 1 is masked with photoresist films 41, as illustrated in FIG. 12.

Successively, boron fluoride (BF₂) as the P-type impurity is implanted with energy of about 10 KeV and dose of about $1 \times 10^{13}/cm^2$ to form the P⁻-type source regions 13a and the P⁻-type drain regions 14a. Herein, the P⁻-type source region 13a and the P⁻-type drain region 14a become the LDD regions. These regions 13a and 14a are formed in the self-alignment manner using the gate electrode 16 as a mask.

Figure 13:
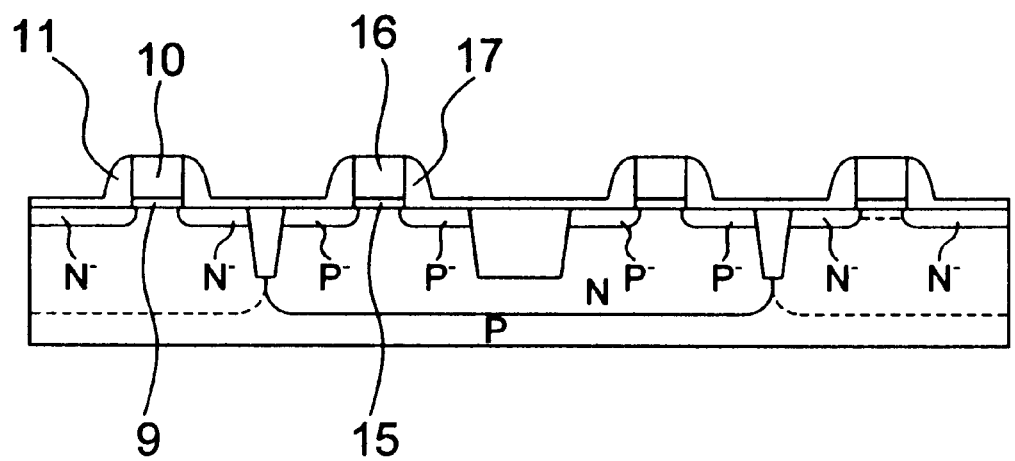
FIG. 13 is a step diagram showing a method of manufacturing a semiconductor memory device according to the first embodiment of this invention.

Next, the photoresist film 41 is removed, as illustrated in FIG. 13. Thereafter, an insulating film, such as, an oxide film is formed on an entire surface by the CVD method.

Successively, the gate insulating film 9, the gate electrode 10, the gate insulating film 15 and the gate electrode 16 are formed by removing the unnecessary portions by the use of the photolithography method. Further, the insulating film spacers 11 and 17 are formed on side surfaces of the gate electrodes 10 and 16.

Herein, each of the insulating film spacers 11 and 17 serves to protect the gate insulating films 9 and 15 and to reduce insulating capacitance formed between the gate region and the source/drain regions.

Figure 14:
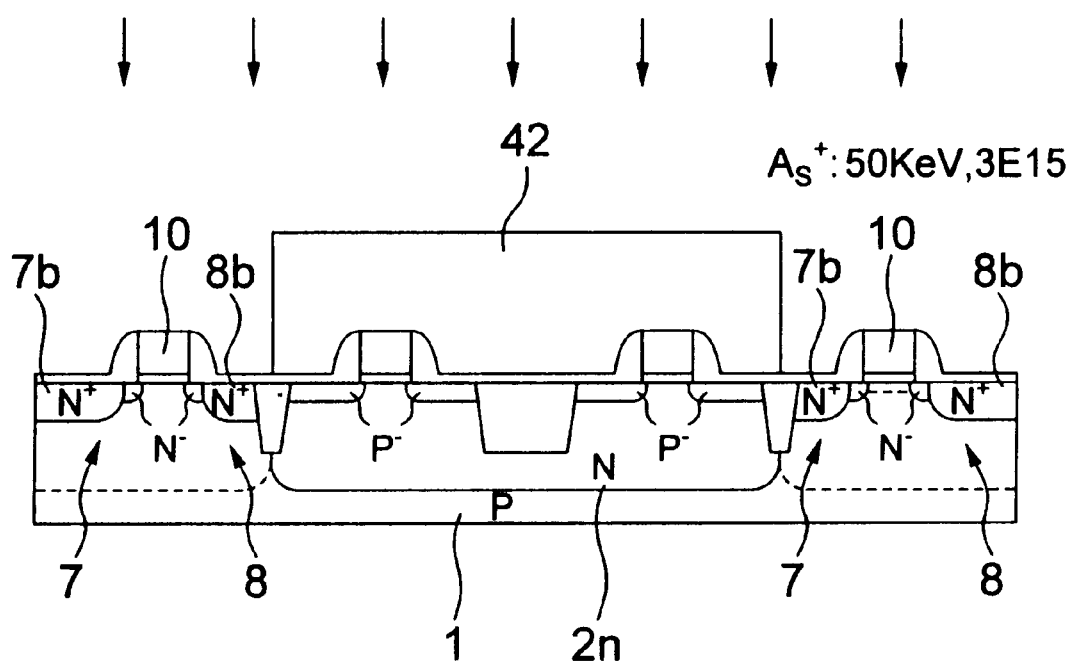
FIG. 14 is a step diagram showing a method of manufacturing a semiconductor memory device according to the first embodiment of this invention.

Subsequently, the region for forming the P-type MOS transistor in the P-type semiconductor substrate 1 is masked by the use of a photoresist film 42, as illustrated in FIG. 14.

Successively, As as the N-type impurity is implanted with energy of about 50 KeV and dose of about $3 \times 10^{15}/cm^2$ to form the N⁺-type source regions 7b and the N⁺-type drain regions 8b at both sides of the gate electrodes 10 in the N-type MOS transistors. Thereby, the N-type source region 7 consisting of the N⁻-type region 7a and the N⁺-type region 7b, and the N-type drain region 8 consisting of the N⁻-type region 8a and the N⁺-type region 8b are formed as active regions, respectively.

Figure 15:
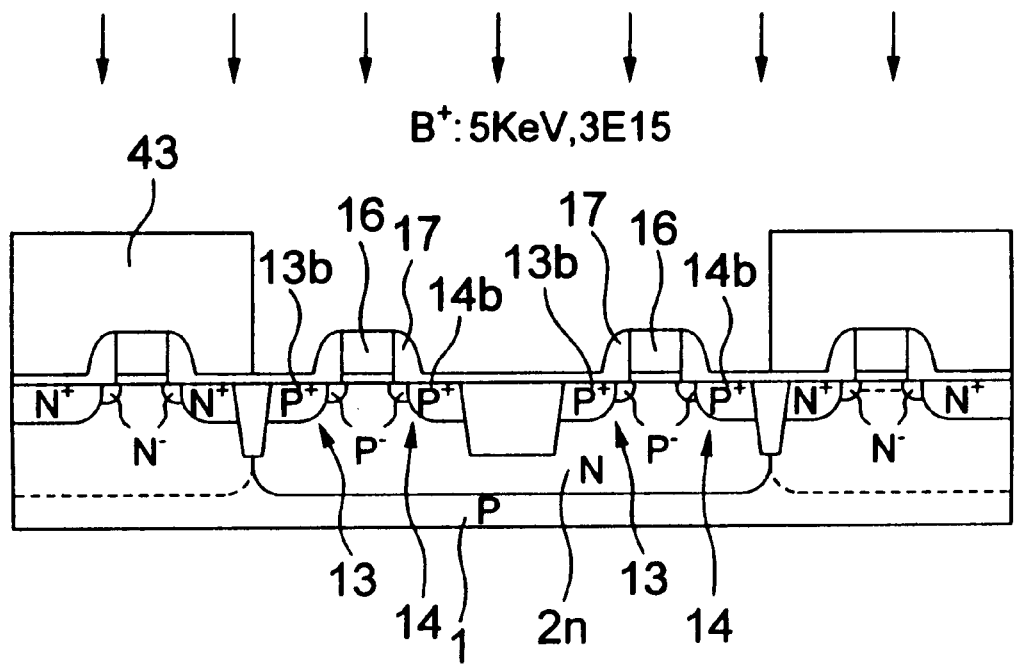
FIG. 15 is a step diagram showing a method of manufacturing a semiconductor memory device according to the first embodiment of this invention.

Subsequently, the region for forming the N-type MOS transistors in the P-type semiconductor substrate 1 is masked by the use of photoresist films 43, as illustrated in FIG. 15.

Successively, boron as the P-type impurity is implanted with energy of about 5 KeV and dose of about $3 \times 10^{15}/cm^2$ to form the P⁺-type source regions 13b and the P⁺-type drain regions 14b at both sides of the gate electrodes 16 in the P-type MOS transistors. Thereby, the P-type source region 13 consisting of the P⁻-type region 13a and the P⁺-type region 13b, and the P-type drain region 14 consisting of the P⁻-type region 14a and the P⁺-type region 14b are formed as active regions, respectively.

Figure 16:
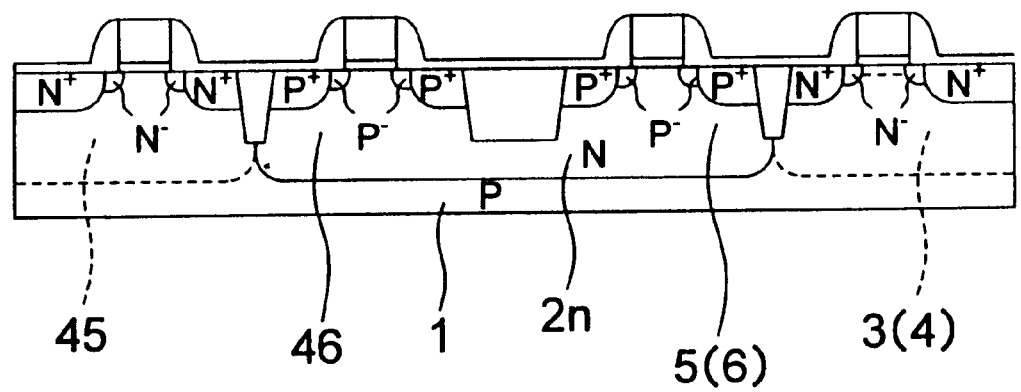
FIG. 16 is a step diagram showing a method of manufacturing a semiconductor memory device according to the first embodiment of this invention.

Next, the photoresist films 43 are removed, as shown in FIG. 16. Consequently, a pair of driving MOS transistors 3, 4 and a pair of MOS transistors 5,6 for selecting the addresses are formed in the memory cell of the P-type semiconductor substrate 1. Herein, it is to be noted that only one N-type MOS transistor or only one P-type MOS transistor is illustrated for convenience in FIG. 16.

Likewise, the N-type MOS transistor 45 and the P-type MOS transistor 46 are formed in the peripheral circuit.

Figure 17:
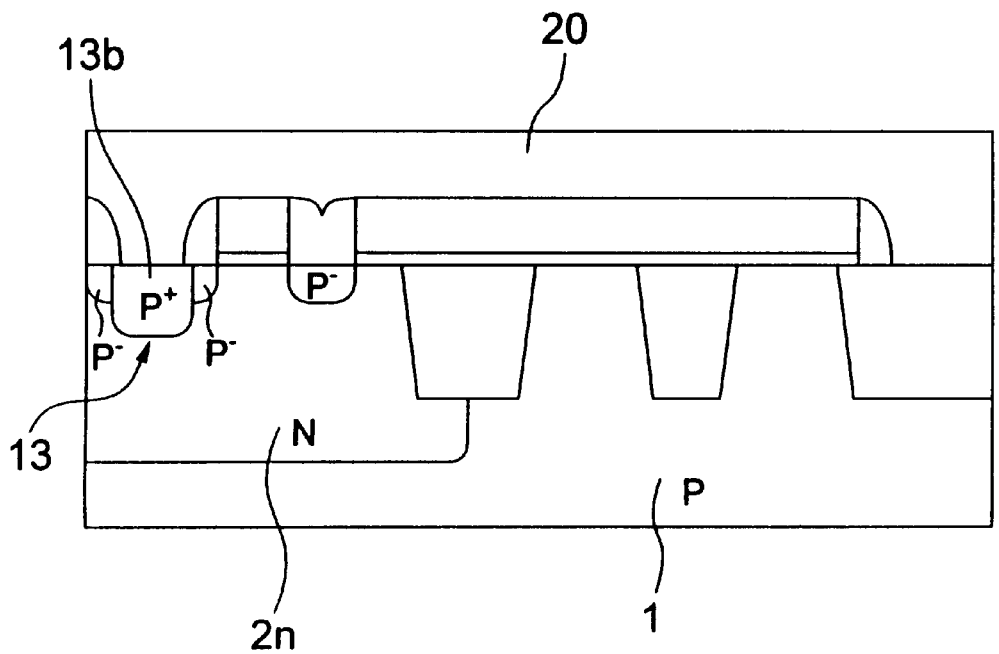
FIG. 17 is a step diagram showing a method of manufacturing a semiconductor memory device according to the first embodiment of this invention.

Subsequently, an opening portion is formed on a surface of the P⁺-type region 13b of the P-type source region 13, as shown in FIG. 17. Thereafter, a first interlayer insulating film 20 is deposited on the entire surface. Herein, the first interlayer insulating film 20 is formed by the oxide film made by the CVD method, the BSG film, the PSG film, and the BPSG film.

Figure 18:
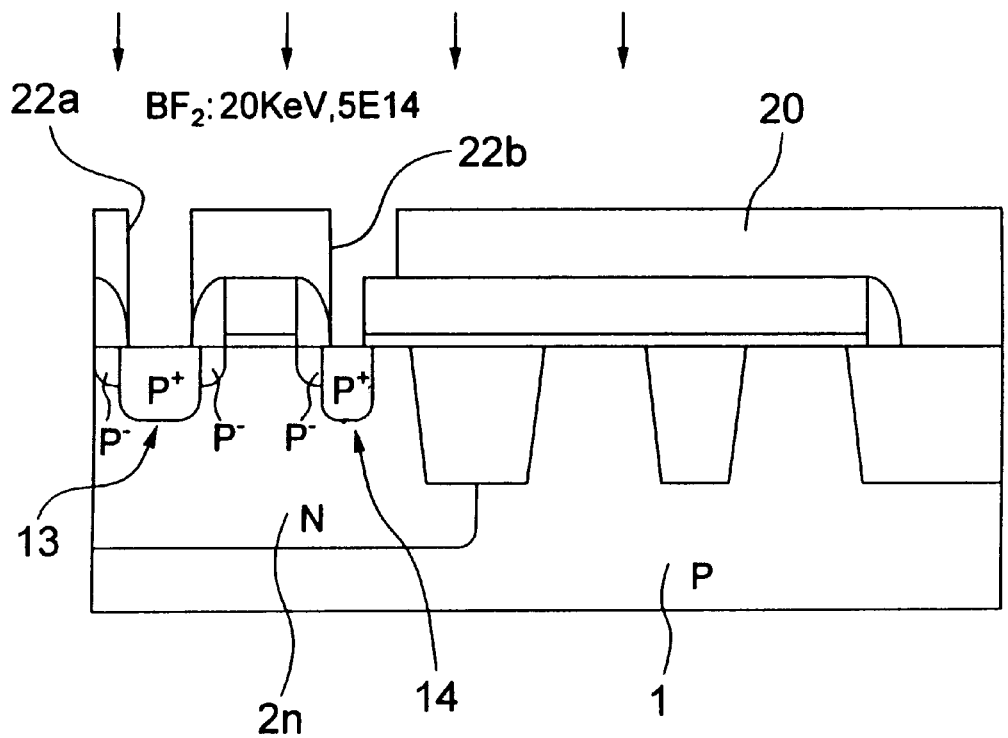
FIG. 18 is a step diagram showing a method of manufacturing a semiconductor memory device according to the first embodiment of this invention.

Next, contact holes 22a, 22b are formed on a surface of the P-type source region 13 and a surface of the P-type drain region 14 of each MOS transistor 5,6, as illustrated in FIG. 18. Although contact holes 21a, 21b (illustrated in FIG. 5) are formed on a surface of the N-type source region 7 and a surface of the N-type drain region 8 of each MOS transistor 3,4 at the same time, the illustration thereof is abbreviated for convenience in FIG. 18.

Successively, $BF_2$ as the P-type impurity is implanted with energy of about 20 KeV and dose of about $5 \times 10^{14}/cm^2$ to form high concentration contact regions for the P-type source region 13 and the P-type drain region 14.

Figure 19:
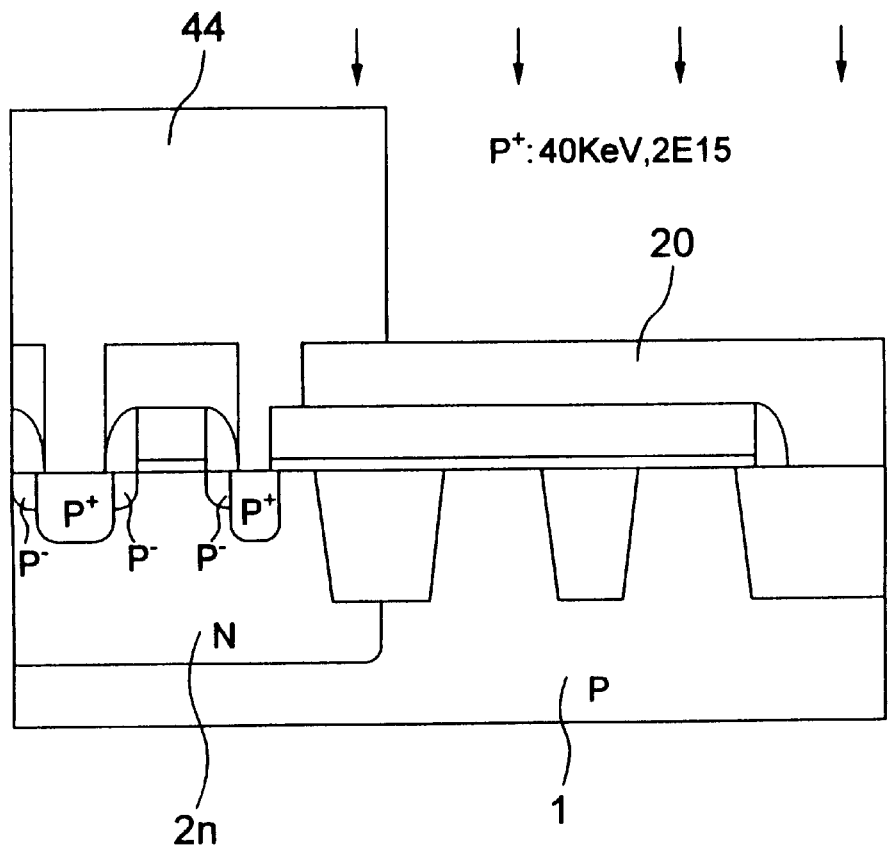
FIG. 19 is a step diagram showing a method of manufacturing a semiconductor memory device according to the first embodiment of this invention.

Subsequently, the region for forming the P-type MOS transistor in the P-type semiconductor substrate 1 is masked with a photoresist film 44, as illustrated in FIG. 19.

Successively, phosphorus as the N-type impurity is implanted with energy of about 40 KeV and dose of about $2 \times 10^{15}/cm^2$ to form contact regions on the surface the N-type source region 7 and the surface of the N-type drain region 8 of the N-type MOS transistors 3,4.

Namely, although ions are doped into each contact hole 21a, 21b, the illustration of the contact region is abbreviated for convenience in FIG. 19.

In this event, the dose of the phosphorus in this step is higher than the dose of the boron in the step illustrated in FIG. 18. In consequence, the N-type contact region having the high concentration is formed on the condition that the boron is formed.

Successively, the W is buried in the viahole 31 by the CVD method to form a W plug 32 which contacts with the intermediate wiring line 29b.

Next, the second metal wiring line 33 consisting of the bit line is formed so as to contact with the W viaplug 32 on the third interlayer insulating film 30. Thus, the semiconductor memory device according to the first embodiment is completed.

In the meanwhile, there are two methods to satisfy the above-mentioned relationship (namely, $|Vthn| > |Vthp|$).

In a first method, boron is implanted into the region for forming the N-type MOS transistor constituting the driving MOS transistor 3,4 in the memory cell to form the threshold voltage setting layer 34 in advance, as illustrated in FIG. 9. Consequently, the threshold voltage (Vthn) of the N-type MOS transistor is increased.

In a second method, boron is implanted into the region for forming the P-type MOS transistor constituting the MOS transistor 5,6 for selecting the address in advance (not shown). Consequently, the threshold voltage (Vthp) of the P-type MOS transistor is lowered.

Static noise margin characteristics of the memory cells obtained the above first and second methods are illustrated in FIG. 3. 24 and 25.

Figure 24:
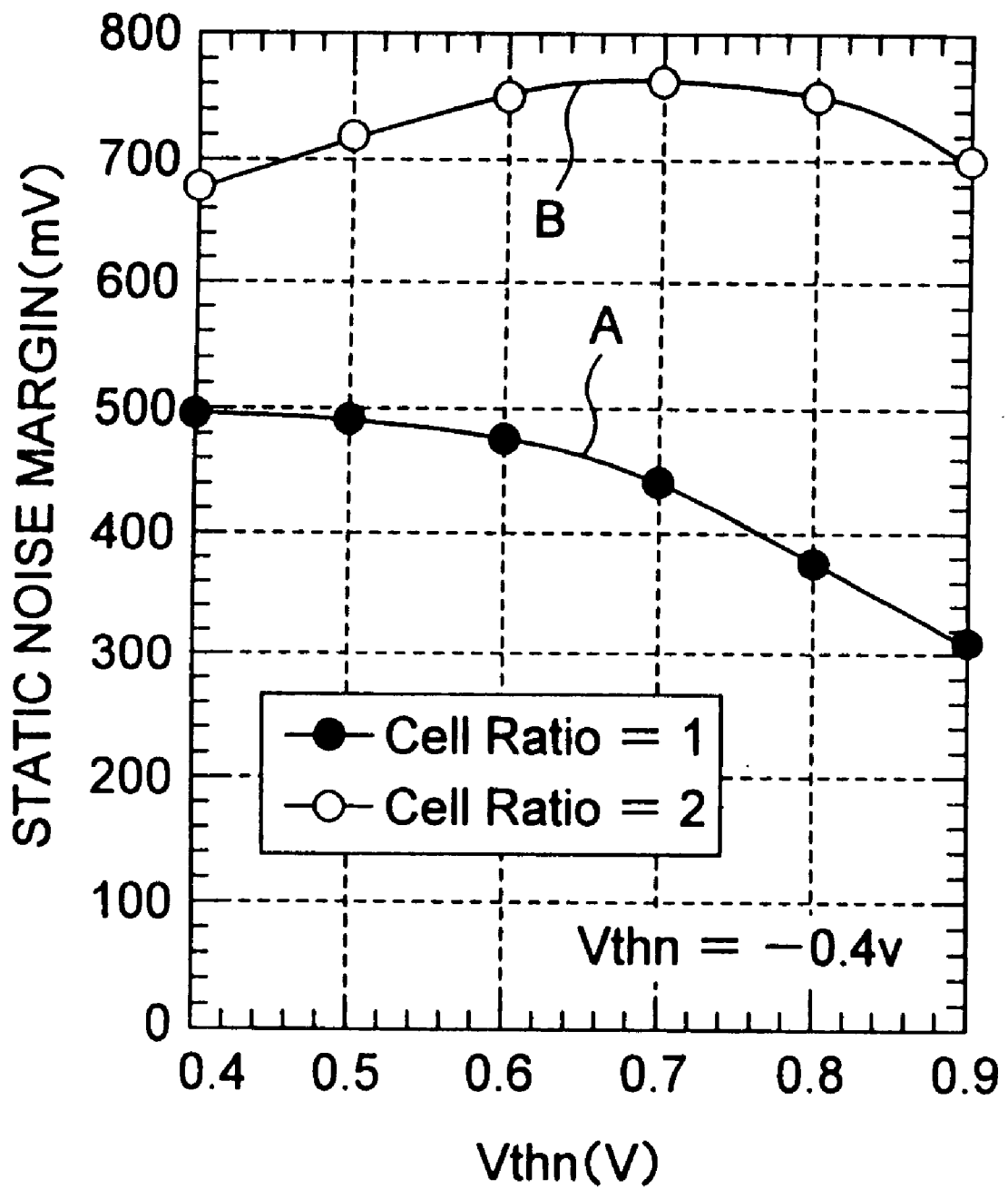
FIG. 24 is a characteristic diagram showing a relationship between a threshold voltage of an N-type MOS transistor and static noise margin.

In FIGS. 24, the abscissa axis represents the threshold voltage of the N-type MOS transistor constituting the driving MOS transistor 3,4 while the vertical axis represents the static noise margin. In this event, the threshold voltage is set to about—4.0 V. completely compensated.

Figure 20:
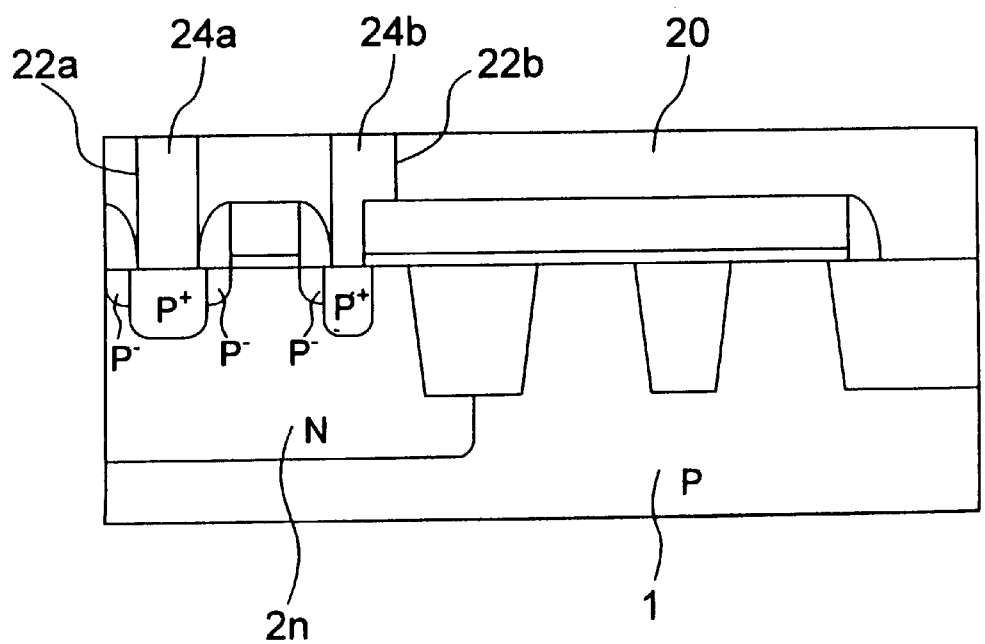
FIG. 20 is a step diagram showing a method of manufacturing a semiconductor memory device according to the first embodiment of this invention.

Subsequently, W is buried in each contact hole 22a, 22b of the first interlayer insulating film 20 by the CVD method to form the W plugs 24a, 24b, as illustrated in FIG. 20.

Although the W plugs 23a, 23b (illustrated in FIG. 5) is formed in each contact hole 21a, 21b at the same time, it is abbreviated for convenience in FIG. 20.

Figure 21:
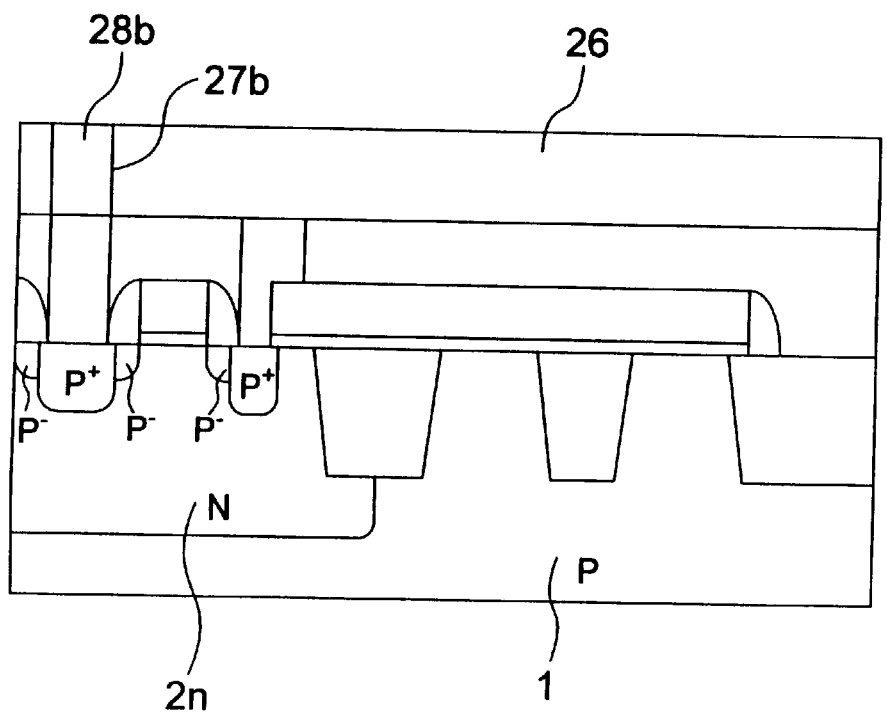
FIG. 21 is a step diagram showing a method of manufacturing a semiconductor memory device according to the first embodiment of this invention.

Next, a second interlayer insulating film 26 is deposited on an entire surface, as illustrated in FIG. 21. Herein, it is to be noted that the second interlayer insulating film 26 is formed by the oxide film made by the CVD method, the BSG film, the PSG film, and the BPSG film. Thereafter, viaholes 27a, 27b are formed by the use of the photolithography method. Successively, W is buried in each viahole 27a, 27b by the CVD method to form each W plug 28a, 28b.

Figure 22:
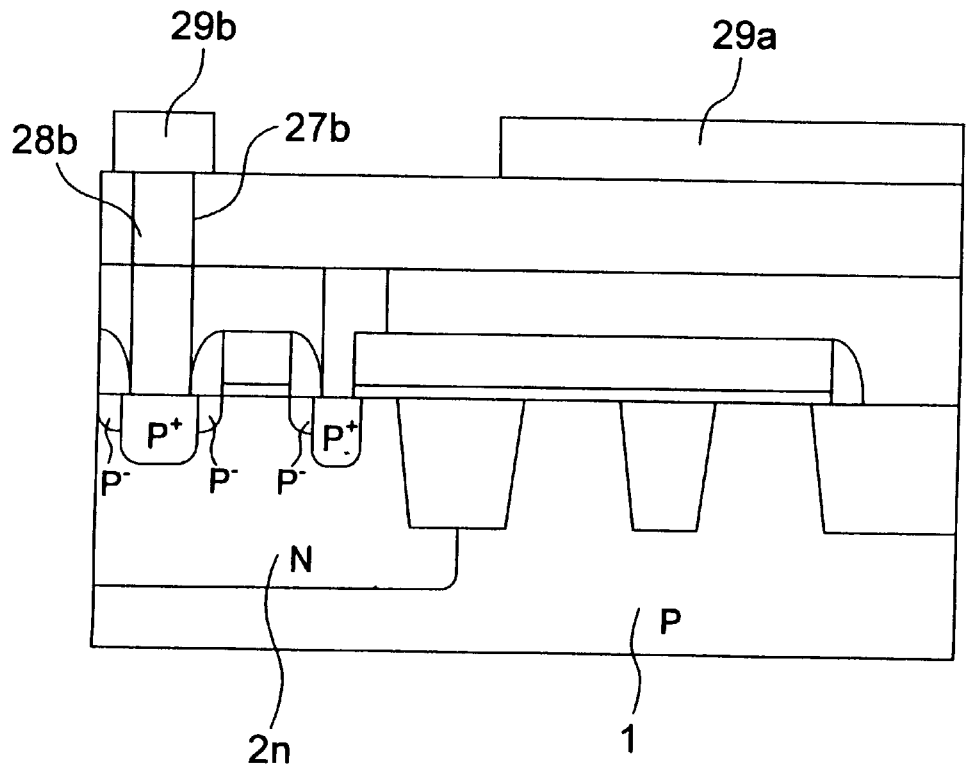
FIG. 22 is a step diagram showing a method of manufacturing a semiconductor memory device according to the first embodiment of this invention.

Subsequently, a W film is deposited on an entire surface by the CVD method, as illustrated in FIG. 22. Thereafter, unnecessary portions are removed by the photolithography method. Thereby, a first metal wiring line 29b and an intermediate wiring line 29a are formed, respectively.

Herein, it is to be noted that the first metal wiring line 29a gives the ground potential so as to contact with the W plug 28a while the intimidate wiring line 29b serves to connect each W plug 28b with the bit line.

Figure 23:
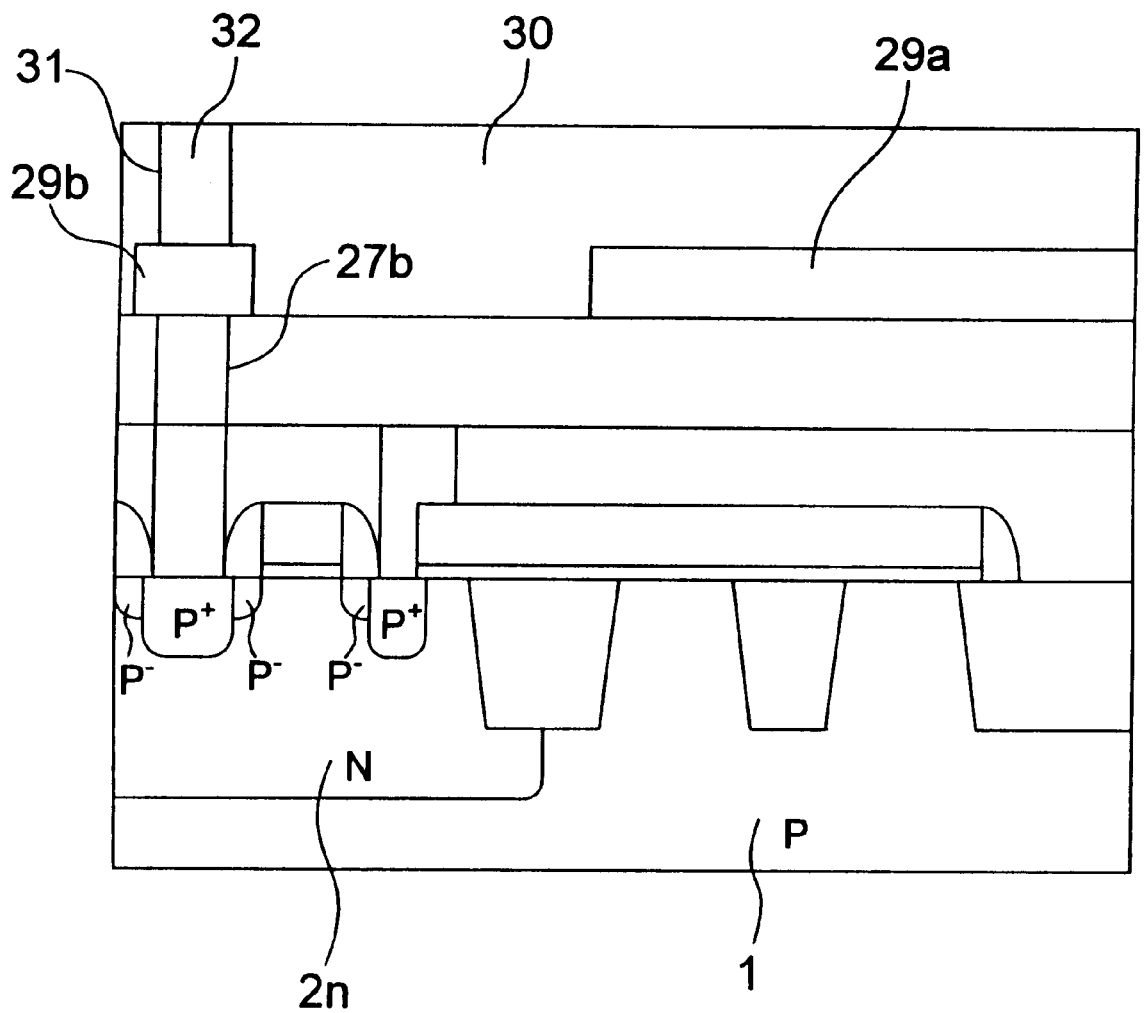
FIG. 23 is a step diagram showing a method of manufacturing a semiconductor memory device according to the first embodiment of this invention.

Next, a third interlayer insulating film 30 is formed on an entire surface by the CVD method, as illustrated in FIG. 23. Herein, it is to be noted that the third interlayer insulating film 30 is formed by the oxide film made by the CVD method, the BSG film, the PSG film, and the BPSG film. Thereafter, a viahole 31 is In FIG. 25, the abscissa axis represents the threshold voltage of the P-type MOS transistor constituting the MOS transistor 5,6 for selecting the address while the vertical axis represents the static noise margin, like in FIG. 24. In this event, the threshold voltage is set to about 4.0 V.

Figure 25:
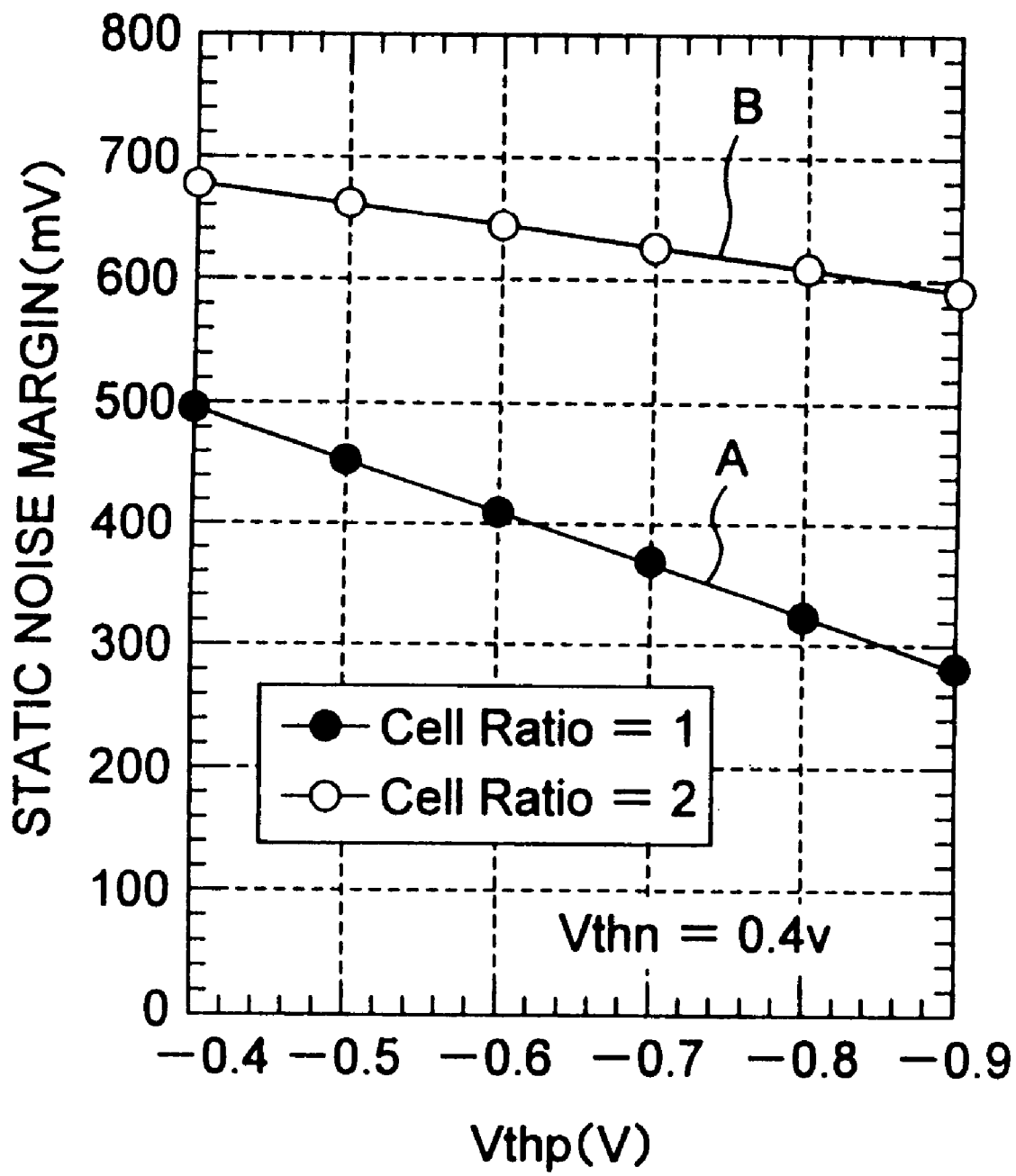
FIG. 25 is a characteristic diagram showing a relationship between a threshold voltage of a P-type MOS transistor and static noise margin.

In FIG. 24 and FIG. 25, ratio between channel width of the driving MOS transistor 3, 4 and the channel width of the MOS transistor 5, 6 for selecting the address is set to about 1:1 in characteristic A. On the other hand, the ratio is set to 2:1 in characteristic B. Each figure (FIG. 24 & FIG. 25) indicates that the characteristic B has higher static noise margin than the characteristic A.

In this case, the area of the memory cell is affected by the channel width. As mentioned before, when the ratio of channel width is set to 1:1, the area of the memory cell can be designed to the minimum. However, when the ratio thereof becomes larger, the area of the driving MOS transistor 3, 4 must be designed larger. Consequently, the area of the memory cell is inevitably increased.

It is generally required to keep the static noise margin of about 300 mV or more to prevent deterioration of the manufacturing yield in the case of the mass production of the memory cell.

However, it is understood that there is no problem for stability of the memory cell if the difference of the absolute values between Vthn and Vthp is 0.5V or less (namely, $|Vthn|-|Vthp|<0.5$) even when the ratio of the channel width is set to 1:1 like the characteristic, as illustrated in FIG. 23 and FIG. 25.

To further keep the stability of the memory cell, it is necessary to keep a state similar to the characteristic B. Specifically, it is required that the channel width of the driving MOS transistor 3, 4 is set larger (namely, 1.5 to 2.0 times of the MOS transistor 5, 6 for selecting the address).

However, even if the range is selected to 0.7 to 2.0 times, sufficient effect can be practically obtained. Thus, there is a trade-off relationship between the stability of the memory cell and the cell area. Therefore, it is desirable that suitable channel width and threshold voltage are selected in accordance with applications.

Further, if the threshold voltage of the driving MOS transistor 3, 4 is set larger with 0.1 to 0.6 V than that of the MOS transistor 5, 6 for selecting the address, suitable effect can be realized.

Within the above threshold voltage, off-current of the driving MOS transistor 3, 4 is set smaller with about one figure to five figure than that of the MOS transistor 5, 6 for selecting the address when both MOS transistors are compared by the off-current.

Namely, if the drain current (off-current) which flows when the source and the gate of the driving MOS transistor 3, 4 have substantially the same potentials is set to smaller with 1/10 to 1/100000 than that of the MOS transistor 5, 6 for selecting the address, suitable effect can be obtained.

Further, it is found out that the former relatively has higher static noise margin than latter by comparing FIG. 24 with FIG. 25.

In the meanwhile, a logic product (for example, having the gate length of 0.25 µm or less) is increasingly miniaturized in future. In such a logic product, the peripheral circuit tends to have relatively low threshold voltage (for example, 0.4V or less).

Taking this into account, it is advantageous that the memory cell has higher static noise margin to stably operate the memory cell. Therefore, it is desirable to satisfy the above-mentioned relationship by increasing the threshold voltage (Vthn) of the N-type MOS transistor using the above-mentioned first method.

Figure 26:
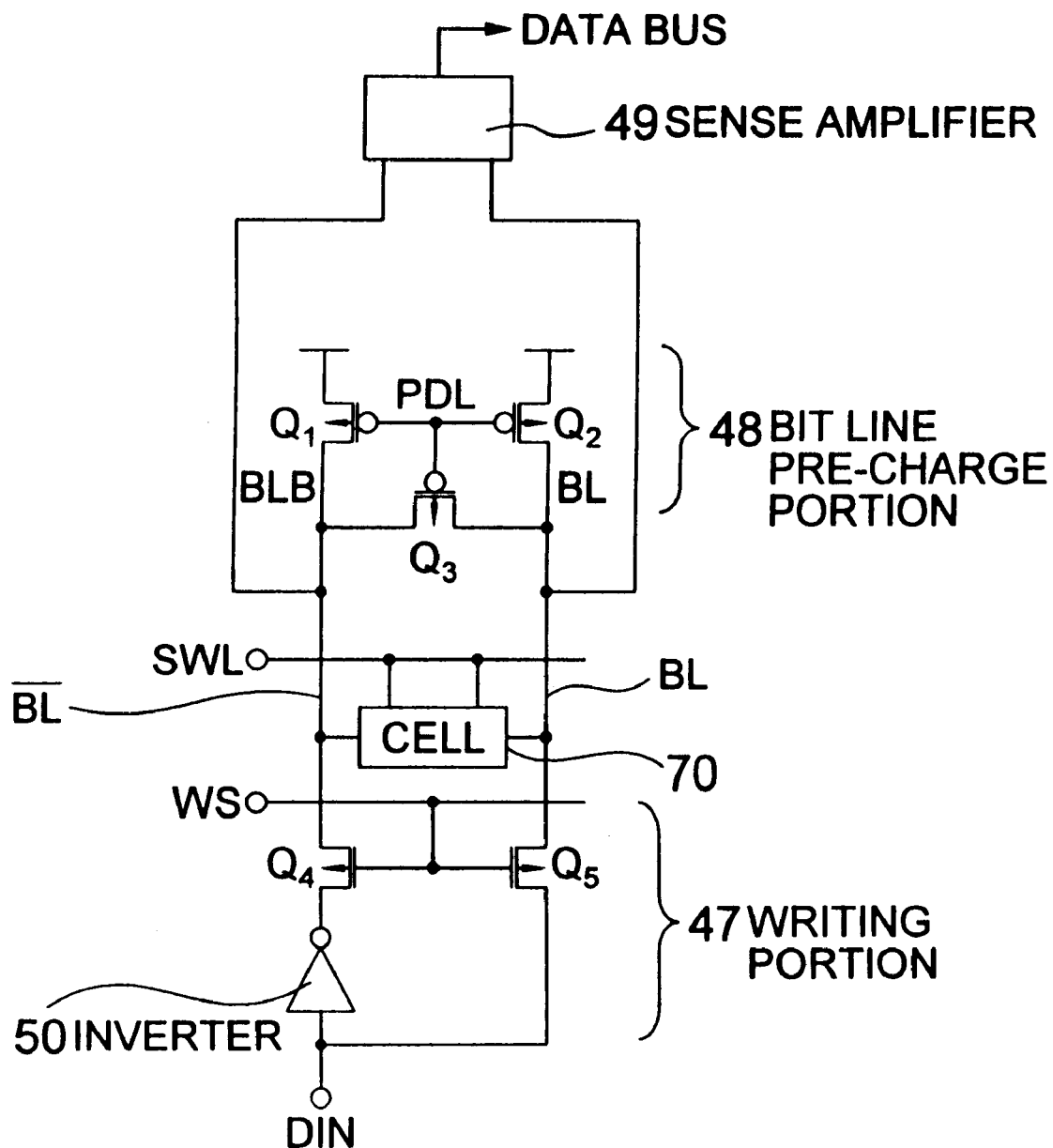
FIG. 26 is a circuit diagram showing a structure of a peripheral circuit of a semiconductor memory device according to the first embodiment of this invention.

The peripheral circuit illustrated in FIG. 26 includes a writing portion 47, a memory cell 70, a bit line pre-charge portion 48, and a sense amplifier 49. In this event, the writing portion 47 writes a data signal into the memory cell 70. The bit line pre-charge portion 48 supplies the power supply potential to the bit line when all of memory cells connected to the bit line are in a non-selective state.

Further, the sense amplifier 49 amplifies a data signal read out from the memory cell 70 and transmits the amplified data signal to a bus line.

In this case, the writing portion 47 is composed of an inverter 50 and transfer gates Q4 and Q5 each of which is, for example, structured by an N-type MOS transistor. The bit line pre-charge portion 48 is composed of transfer gates Q1 to Q3 each of which is structured by a P-type MOS transistor.

In this event, each of the transfer gate transistors Q1 to Q3 serves to completely transmit a power supply potential into the bit line. Therefore, when the N-type MOS transistor is used, there is no potential difference between the gate and the source. Consequently, the transfer gate consisting of the N-type MOS transistor can not perform the above-mentioned function.

The sense amplifier 49 is, for example, is structured by an amplifier circuit, such as, the current/mirror type amplifier. Further, each of transistors which constitute the peripheral circuit has the same threshold voltage mentioned before. Moreover, the power supply voltage is set to 2.5 V.

Subsequently, description will be made about an operation of the peripheral circuit with reference to operation waveform illustrated in FIG. 27.

In the writing operation, a data signal of the memory cell 70 is reversed by reducing another potential of the bit line. A signal given to the bit line during the reading operation is amplified by the sense amplifier 49 and is supplied into the bus line because the signal at a lower potential side is not reduced to the ground potential. This is because each of the transfer gates Q1 to Q3 of the bit line pre-charge portion 48 is composed of the P-type MOS transistor.

Figure 27:
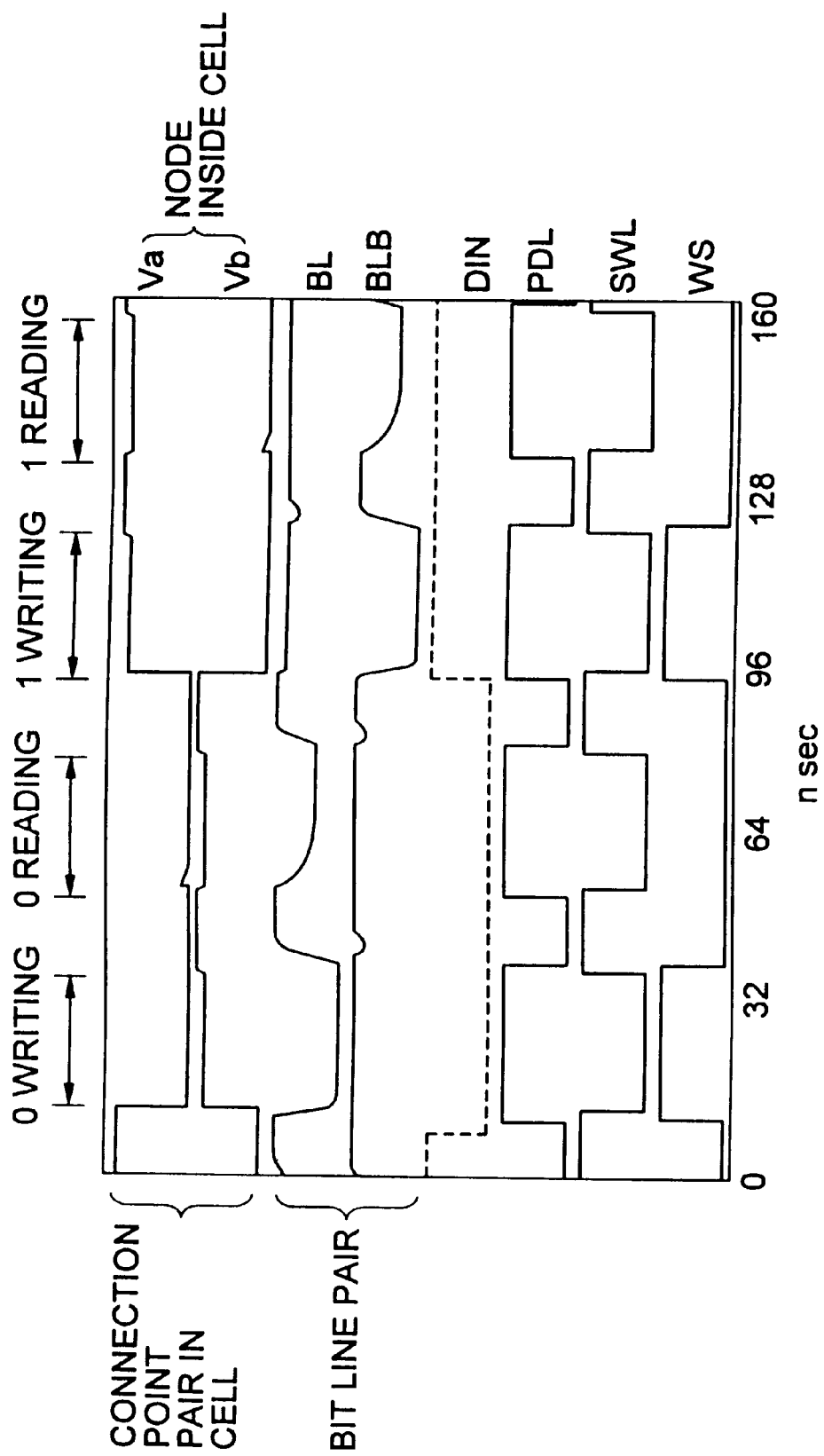
FIG. 27 is an operational waveform diagram of the peripheral circuit illustrated in FIG. 26.

In FIG. 27, the abscissa axis indicates time (sec) while the vertical axis indicates a voltage (volt). Further, all signal amplitudes indicate about 1.8 V.

In FIG. 27, the operation is carried out with the sequence of pre-charge, "0" writing, pre-charge, "0" reading, pre-charge, "1" writing, pre-charge, "1" reading.

First, during the pre-charge, "High" is given to a pre-charge control signal PDL, and a pair of two bit lines becomes the power supply potential. Further, "Low" is given to a writing control signal WS, and "High" is given to a word line SWL. In this case, both the writing portion 47 and the memory cell 70 are separated from the bit line.

In the writing operation, PDL becomes "High" and the bit line pre-charge portion is separated from the power supply. At the same time, "Low" is given to the word line, and the memory cell 70 is coupled to the bit line. Further, WS becomes "High".

Consequently, a signal given into an input signal IN is transmitted to the bit line and the memory cell 70 via the MOS transistor Q5 while the reversed signal is transmitted to the bit line and the memory cell 70 via the MOS transistor Q4.

During the reading operation, PDL becomes "High" and the bit line is separated from the bit line pre-charge portion 48. At the same time, "Low" is given to the word line, and a specific memory cell is selected and is coupled to the bit line. This operation is the same as the writing operation.

However, WS is kept to "High". Consequently, the potential of the memory cell 70 is outputted to the bit line on the condition that the writing portion 47 is separated.

More specifically, another bit line is coupled to the ground potential via the driving MOS transistor which is in an on state in the memory cell 70. At this time, the bit line potential of the low potential side is not reduced to the ground potential, as illustrated is the waveform of FIG. 27.

This is because the word line of the memory cell is composed of the P-type MOS transistor. In this case, no problem occurs because the complementary signals are amplified by the sense amplifier 49 and is outputted to the data bus.

In above-mentioned all operation, each potential of contact pair in the memory cell is kept to a full-swing signal between the power supply potential and the ground potential. Thereby, sufficient resistance to soft-error can be obtained.

In the memory cell of this example, it is necessary that the pre-charge operation is carried out with a constant cycle, as illustrated in the waveform of FIG. 27. This reason will be explained as follows.

Namely, when the writing or reading operation continues, "High" of the non-selective cell which is coupled to the same bit line (which is coupled to the other word line) can not be kept because the potential of another bit line becomes lower than the power supply potential.

In particular, when the writing state permanently continues, "High" potential of the non-selective cell which is coupled to the bit line of the low potential side is lowered by the leak current of the MOS transistor 5,6 for selecting the address. In consequence, all of cell data signals may be destroyed.

Under this circumstance, each potential of the contact in the memory cell is recovered by the pre-charge of the same time. Therefore, it is desirable that half time in the operation cycle corresponds to the pre-charge time.

With the above-mentioned structure of this example, the threshold voltage Vthn of each driving MOS transistor 3,4 consisting of the N-type MOS transistor is set larger than a threshold voltage Vthp of each MOS transistor 5, 6 for selecting the address consisting of the P-type MOS transistor in the memory cell of the SRAM having no the driving device.

In consequence, the data signal of the memory cell can be retained by using the two kinds of potentials (the normal power supply potential and the ground potential) without the third potential.

Namely, the leak current ILp of each MOS transistor 5, 6 for selecting the address becomes larger than the leak current ILn of each driving MOS transistor 3, 4 by satisfying the above-mentioned relationship (|Vthn|>|Vthp|). Namely, the relationship of (ILp>ILn) can be satisfied.

Thereby, when the power supply potential is given to the gate electrode of each MOS transistor 5, 6 for selecting the address during the stand-by operation, the elimination of the electric charge can be compensated by flowing sub-threshold current into each MOS transistor 5, 6.

Consequently, the output node of each driving MOS transistor 3, 4 can be kept to the power supply potential. As a result, the date signal can be retained because the elimination of the electric charge of the memory cell can be compensated, as mentioned before.

Moreover, the third potential becomes unnecessary by using only the two kinds of potentials, as mentioned above. In consequence, the peripheral circuit of the SRAM does not become complex.

(Second Embodiment)

Referring FIGS. 28 through 30, description will be made about a semiconductor memory cell according to a second embodiment of this invention.

In a semiconductor memory device according to the second embodiment, arrangements of the driving MOS transistor and the MOS transistor for selecting the address are changed different from the first embodiment.

Figure 28:
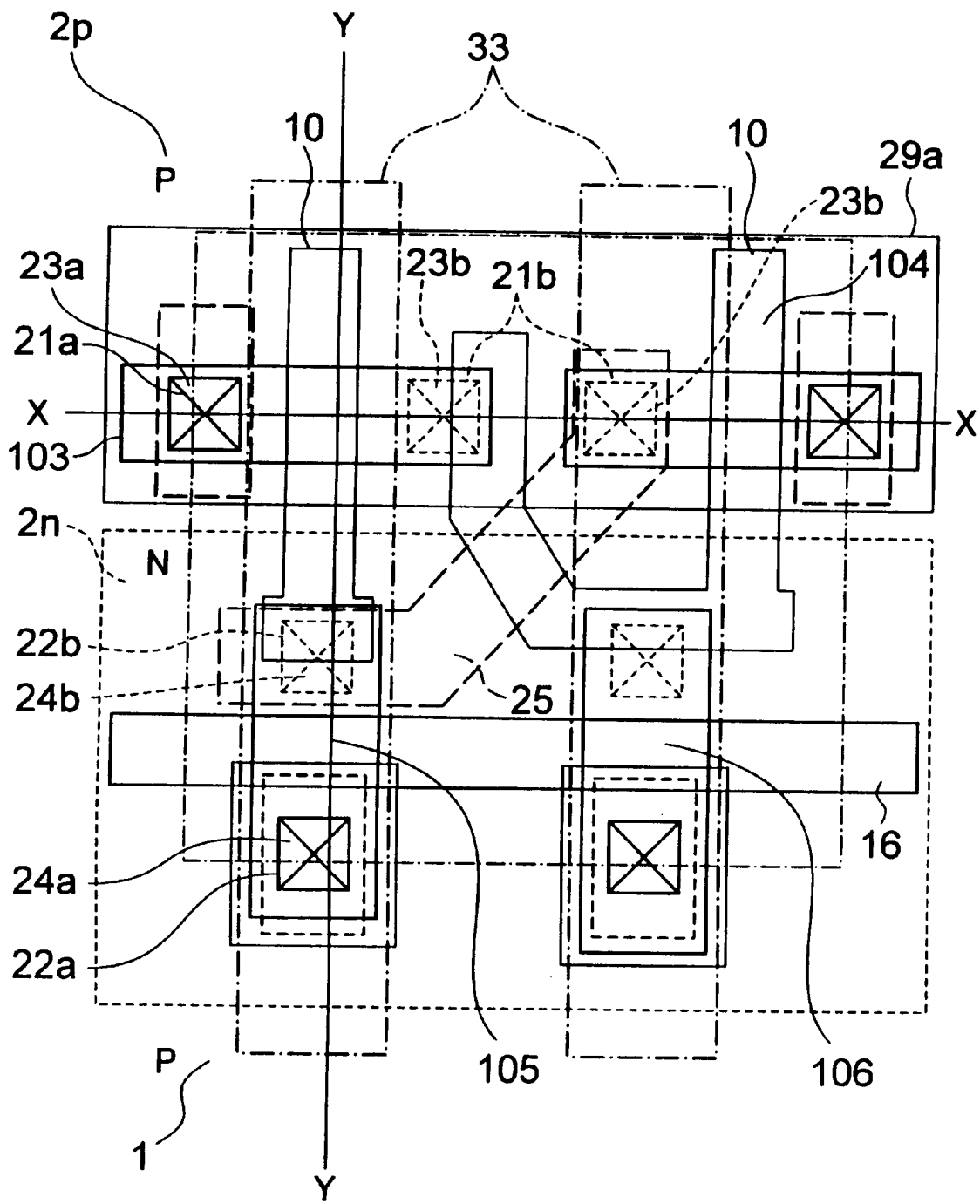
FIG. 28 is a plane view showing a structure of a semiconductor memory device according to a second embodiment of this invention.
Figure 29:
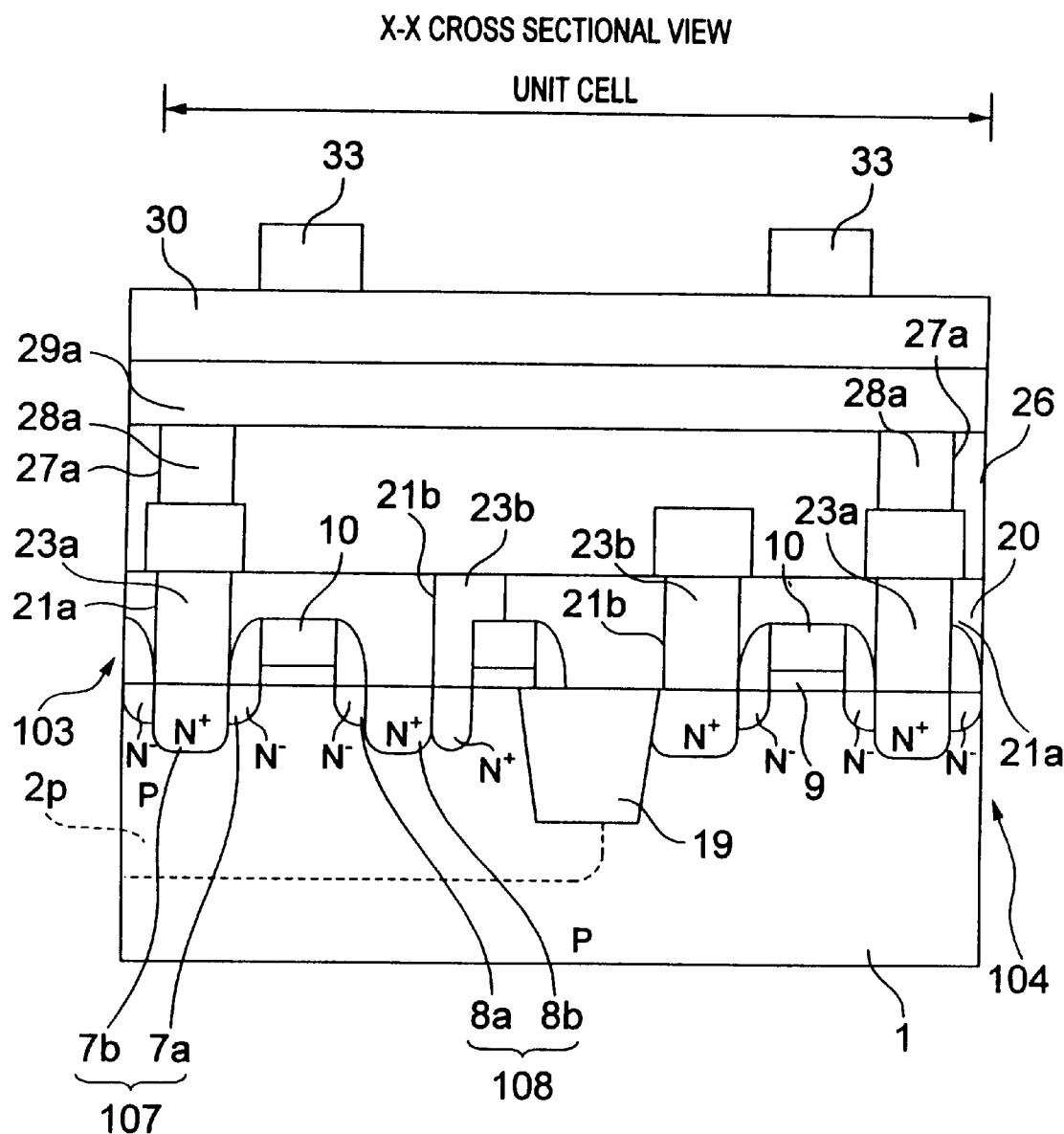
FIG. 29 is a cross sectional view, taken the semiconductor memory device illustrate in FIG. 28 along X—X line.
Figure 30:
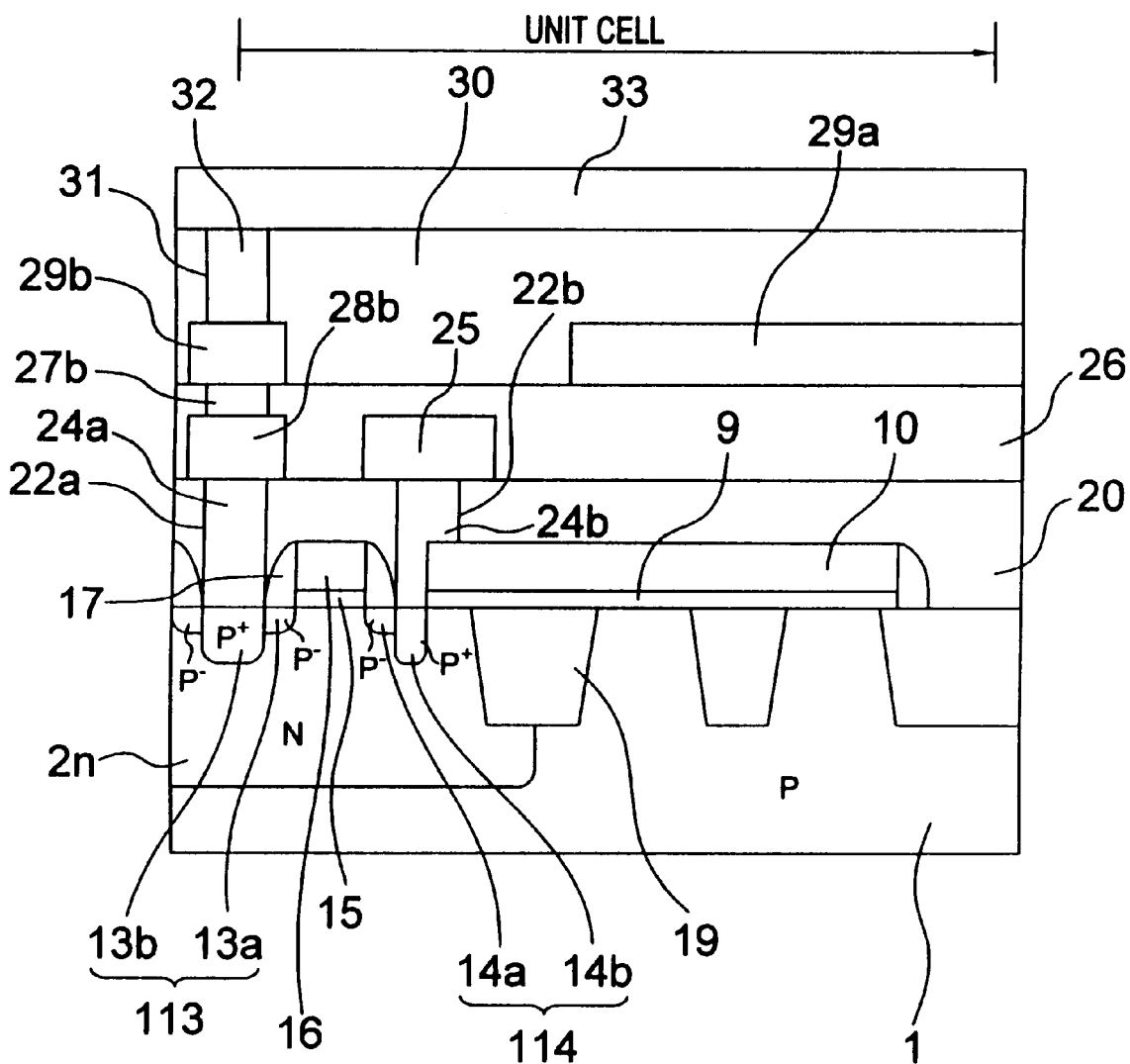
FIG. 30 is a cross sectional view, taken the semiconductor memory device illustrated in FIG. 28 along Y—Y line.

As illustrated in FIGS. 28 through 30, the N-type source region 107 and drain region 108 (namely, active regions) are arranged in series on a straight line in the P-type semiconductor substrate 1. In this event, the N-type source region 107 and drain region 108 constitute a pair of driving MOS transistors 103, 104 consisting of the N-type MOS transistor.

On the other hand, the P-type source region 113 and drain region 114 (namely, active regions) are arranged parallel to the P-type semiconductor substrate 1. In this case, the P-type source region 113 and drain region 114 constitute a pair of MOS transistors 105, 106 for selecting the addresses consisting of the P-type MOS transistors.

In particular, the N-type source region 107 and drain region 108, which are the active regions of the driving MOS transistors 103 and 104, are arranged on a straight line, as mentioned before. Thereby, a pair of driving MOS transistors 103 and 104 can be arranged with excellent balance.

Consequently, the characteristics thereof can be substantially identical to each other. As a result, variation of the characteristics of the driving MOS transistors 103, 104, which determines the characteristic of the memory cell, can be prevented.

The gate electrode 10 is connected to the N-type drain region 8 via the W plug 23b which is the drain electrode of the driving MOS transistor 103, 104. Further, the gate electrode 10 is connected to the P-type drain region 14 via the W plug 24b which is the drain electrode of the MOS transistor 105, 106 for selecting the address.

Moreover, the drain connection point of the driving MOS transistor 104 is connected to the drain connection point of the MOS transistor 105 for selecting the address on the W plugs 23a, 23b and the W plugs 24a, 24b via a local wiring line 25 formed by W and the like.

Further, the local wiring line 25 is also connected to the drain connection point of the driving MOS transistor 103 and the drain connection point of the MOS transistor 106 for selecting the address as a junction with the upper layer wiring line.

In this event, the surface of the local wiring line 25 is coated with the second interlayer insulating film 26 which is formed by an oxide film formed by the CVD method, a BSG film, a PSG film, and a BPSG film.

The second embodiment is similar to the first embodiment except for the above-mentioned structure. Therefore, the same numeral references are attached to the respective portions corresponding to FIGS. 4 through 7 in FIGS. 28 through 30. In this event, detail description of the same portions is abbreviated in the second embodiment.

As mentioned before, the substantially same effect as the first embodiment can be obtained in the second embodiment.

In addition, a pair of the driving MOS transistors can be formed without variation of characteristic according to the second embodiment.

While this invention has thus far been disclosed in conjunction with the embodiments thereof, it will be readily possible for those skilled in the art to put this invention into practice in various other manners.

For instance, the transistor is not limited to the MOS transistor, and may be a MIS transistor (Metal Insulator Semiconductor). This MIS transistor may be formed by nitride or double films of oxide and nitride instead of the oxide.

Further, the conductive type of each semiconductor region or the semiconductor substrate may be reversed between the N-type and the P-type. Namely, the driving MOS transistor may be composed of the P-type MOS transistor while the MOS transistor for selecting the address may be composed of the N-type MOS transistor.

In this case, the output node of the driving MOS transistor is kept to the ground potential to retain the data signal of the memory cell.

Moreover, the method for setting the threshold voltage of the MOS transistor is not restricted to the condition described in the above-mentioned embodiment, and may be modified as needed.

What is claimed is:

1. A semiconductor memory device having a first and second bit lines and a word line, comprising:

a first MIS transistor for driving, which has a first input electrode and a first output electrode and which has a first conductive type and a first threshold voltage;

a second MIS transistor for driving, which has a second input electrode and a second output electrode and which has the first conductive type and the first threshold voltage, the first input electrode being connected to the second output electrode while the second input electrode being connected to the first output electrode;

a third MIS transistor for selecting an address, which is connected between the first bit line and the first output electrode and which has a third input electrode and has a second conductive type and a second threshold voltage, the third input electrode being connected to the word line and the second conductive type being opposite to the first conductive type; and a fourth MIS transistor for selecting an address, which is connected between the second bit line and the second output electrode and which has a fourth input electrode and has the second conductive type and the second threshold voltage, the fourth input electrode being connected to the word line;

the first threshold voltage exceeding the second threshold voltage.

2. A device as claimed in claim 1, wherein:
each of said first and second MIS transistors includes a channel region,
a threshold voltage setting layer is placed in said channel region, and
the first threshold voltage is set larger than the second threshold voltage via said threshold voltage setting layer.

3. A device as claimed in claim 2, wherein:
said threshold voltage setting layer includes impurity of the second conductive type.

4. A device as claimed in claim 1, wherein:
the first threshold voltage is larger than the second threshold voltage within the range between 0.1 and 0.6 V.

5. A device as claimed in claim 1, wherein:
each of said first and second MIS transistors has first leak current,
each of said second and third MIS transistor has second leak current, and
the second leak current exceeds the first leak current.

6. A device as claimed in claim 5, wherein:
sub-threshold current flows through each of said first and second MIS transistors when a power supply potential is given thereto during a stand-by operation.

7. A device as claimed in claim 1, wherein:
each of said first and second MIS transistors has first off-current,
each of said third and fourth MIS transistors has second off-current, and
the first off-current is smaller than the second off-current within the range between 1/10 and 1/100000.

8. A device as claimed in claim 1, wherein:
each of said first and second MIS transistors has first channel width,
each of said third and fourth MIS transistors has second channel width, and
the first channel width is larger than the second channel width within the range between 0.7 and 2.0 times.

9. A device as claimed in claim 1, wherein:
the first conductive type is an N-type while the second conductive type is a P-type.

10. A device as claimed in claim 9, wherein:
a power supply potential is given to each of said third and fourth MIS transistors when a data signal is retained.

11. A device as claimed in claim 1, wherein:
the first conductive type is a P-type while the second conductive type is an N-type.

12. A device as claimed in claim 10, wherein:
a ground potential is given to each of said third and fourth MIS transistors when a data signal is retained.

13. A device as claimed in claim 1, further comprising:
a peripheral circuit which has a fifth MIS transistor and a sixth MIS transistor,
said fifth MIS transistor having the first conductive type and a third threshold voltage while said sixth MIS transistor having the second conductive type and a forth threshold voltage,
the third threshold voltage being substantially equal to the fourth threshold voltage.

14. A device as claimed in claim 13, wherein:
the first threshold voltage exceeds each of the third and fourth threshold voltages.

15. A device as claimed in claim 1, wherein:
first current flows through each of said first and second MIS transistors in a first direction, and
second current flows through each of said third and fourth MIS transistors in a second direction,
the first direction being substantially perpendicular to the second direction.

16. A device as claimed in claim 1, wherein:
each of said first, second, third and fourth MIS transistors has an active region,
said active region being formed in a substantially rectangular shape.

17. A device as claimed in claim 1, wherein:
said first and second MIS transistors has first active regions, and
said third and fourth MIS transistors has second active regions,
said first active regions being arranged in series while said second active regions being arranged in parallel.

* * * * *